US010090321B2

(12) United States Patent
Nakajima

(10) Patent No.: US 10,090,321 B2
(45) Date of Patent: Oct. 2, 2018

(54) INTEGRATED CIRCUIT DEVICE AND METHOD FOR MANUFACTURING SAME

(71) Applicant: Toshiba Memory Corporation, Minato-ku (JP)

(72) Inventor: Shingo Nakajima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/456,014

(22) Filed: Mar. 10, 2017

(65) Prior Publication Data
US 2018/0090511 A1  Mar. 29, 2018

(30) Foreign Application Priority Data

Sep. 23, 2016 (JP) .................. 2016-185166

(51) Int. Cl.
| | |
|---|---|
| H01L 27/11573 | (2017.01) |
| H01L 27/11582 | (2017.01) |
| H01L 27/11565 | (2017.01) |
| H01L 21/28 | (2006.01) |
| H01L 21/311 | (2006.01) |
| H01L 27/11568 | (2017.01) |
| H01L 21/768 | (2006.01) |
| H01L 23/528 | (2006.01) |
| H01L 23/522 | (2006.01) |

(52) U.S. Cl.
CPC .. *H01L 27/11582* (2013.01); *H01L 21/28282* (2013.01); *H01L 21/31111* (2013.01); *H01L 21/76897* (2013.01); *H01L 23/528* (2013.01); *H01L 23/5226* (2013.01); *H01L 27/11565* (2013.01); *H01L 27/11568* (2013.01); *H01L 27/11573* (2013.01)

(58) Field of Classification Search
CPC ..................... H01L 27/11573; H01L 21/76831
USPC .................................. 257/774, 775, E21.578
See application file for complete search history.

(56) References Cited

U.S. PATENT DOCUMENTS

| | | | | |
|---|---|---|---|---|
| 6,156,664 A * | 12/2000 | Gau | ................. | H01L 21/76831 257/E21.577 |
| 9,142,453 B1 * | 9/2015 | Chiu | ................. | H01L 21/76844 |
| 9,397,109 B1 | 7/2016 | Fukuzumi | | |
| 2010/0109072 A1 | 5/2010 | Kidoh et al. | | |

FOREIGN PATENT DOCUMENTS

JP          2010-114204          5/2010

* cited by examiner

*Primary Examiner* — Mark Prenty
(74) *Attorney, Agent, or Firm* — Oblon, McClelland, Maier & Neustadt, L.L.P.

(57) ABSTRACT

An integrated circuit device includes an insulating film, a contact extending in a first direction and being provided inside the insulating film, and an insulating member. A composition of the insulating member is different from a composition of the insulating film. A level difference is formed in a side surface of the contact, a portion of a region of the side surface other than the level difference contacts the insulating film. The insulating member contacts the level difference.

11 Claims, 37 Drawing Sheets

US 10,090,321 B2

INTEGRATED CIRCUIT DEVICE AND METHOD FOR MANUFACTURING SAME

CROSS-REFERENCE TO RELATED APPLICATIONS

This application is based upon and claims the benefit of priority from Japanese Patent Application No. 2016-185166, filed on Sep. 23, 2016; the entire contents of which are incorporated herein by reference.

FIELD

Embodiments relate to an integrated circuit device and a method for manufacturing the same.

BACKGROUND

In recent years, a stacked type memory device has been proposed in which a semiconductor member pierces a stacked body including alternately-stacked electrode films and insulating films. In such a stacked type memory device, processes are necessary to form holes extending in the stacking direction in the stacked body or in the peripheral portion of the stacked body and to fill a semiconductor member or a conductive member into the holes. However, when the aspect ratio of the holes is increased to increase the bit density, the formation of the holes undesirably becomes difficult.

To form holes having a high aspect ratio, technology has been proposed to divide the formation of the holes into two. However, in such a case, the joint portions of the holes undesirably become wide; and the parasitic capacitance between the semiconductor members or the conductive members filled into the holes undesirably increases.

DETAILED DESCRIPTION

In general, according to one embodiment, an integrated circuit device includes an insulating film, a contact extending in a first direction and being provided inside the insulating film, and an insulating member. A composition of the insulating member is different from a composition of the insulating film. A level difference is formed in a side surface of the contact, a portion of a region of the side surface other than the level difference contacts the insulating film. The insulating member contacts the level difference.

First Embodiment

First, a first embodiment will be described.

Figure 1:
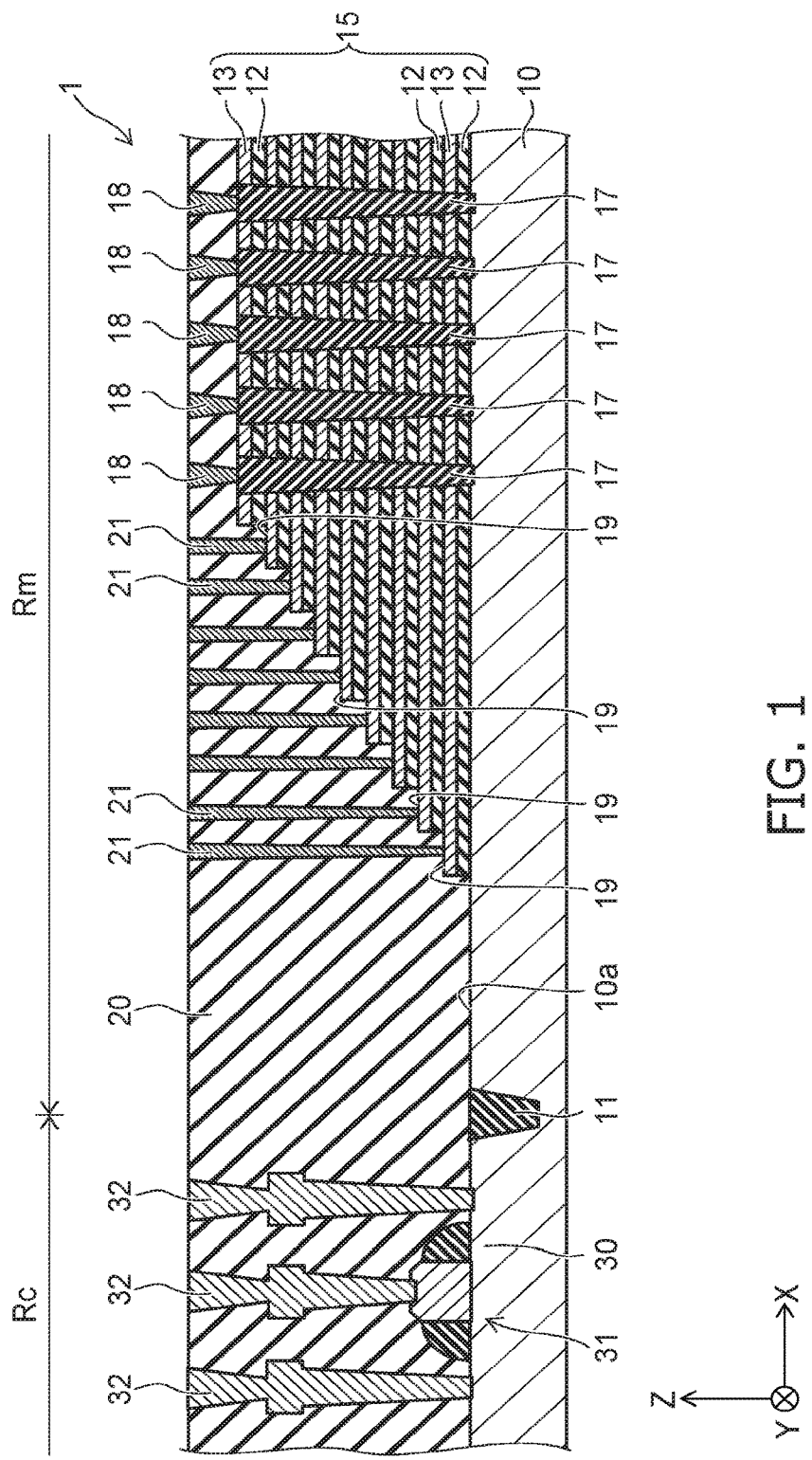
FIG. 1 is a cross-sectional view showing an integrated circuit device according to a first embodiment.

FIG. 1 is a cross-sectional view showing an integrated circuit device according to the embodiment.

Figure 2:
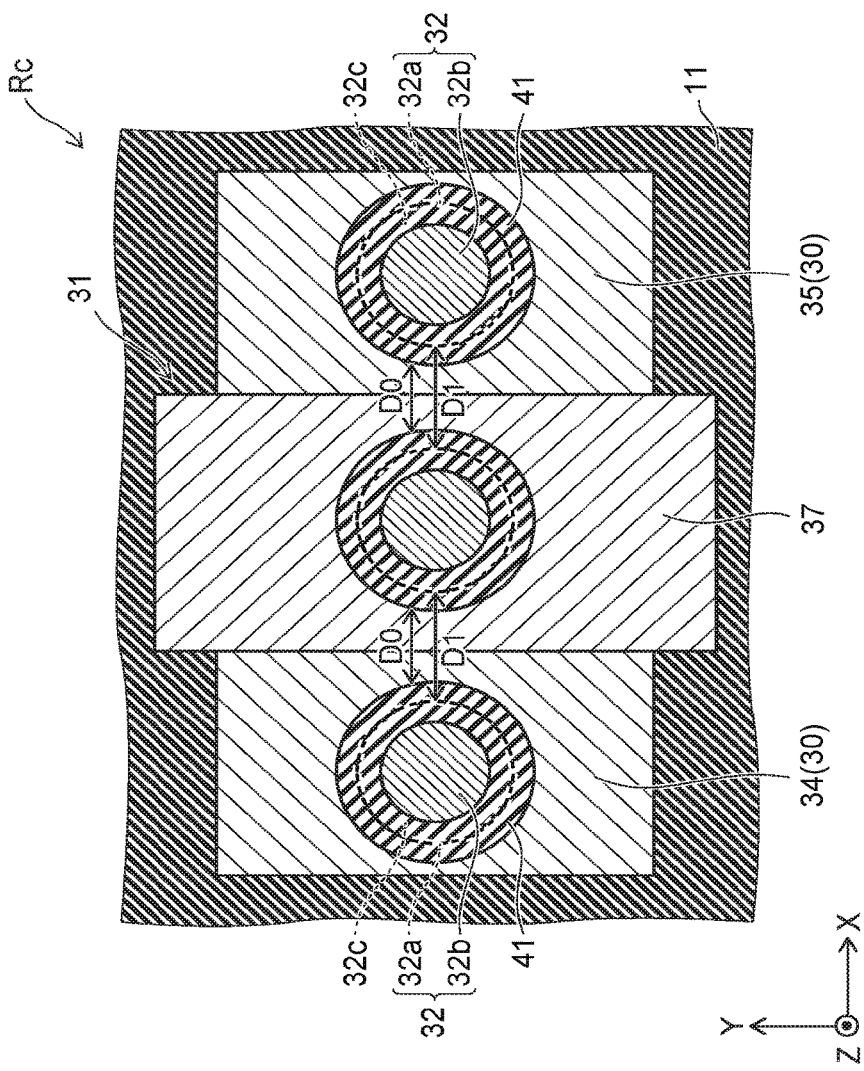
FIG. 2 is a plan view showing a peripheral circuit region of the integrated circuit device according to the first embodiment.

FIG. 2 is a plan view showing a peripheral circuit region of the integrated circuit device according to the embodiment.

Figure 3:
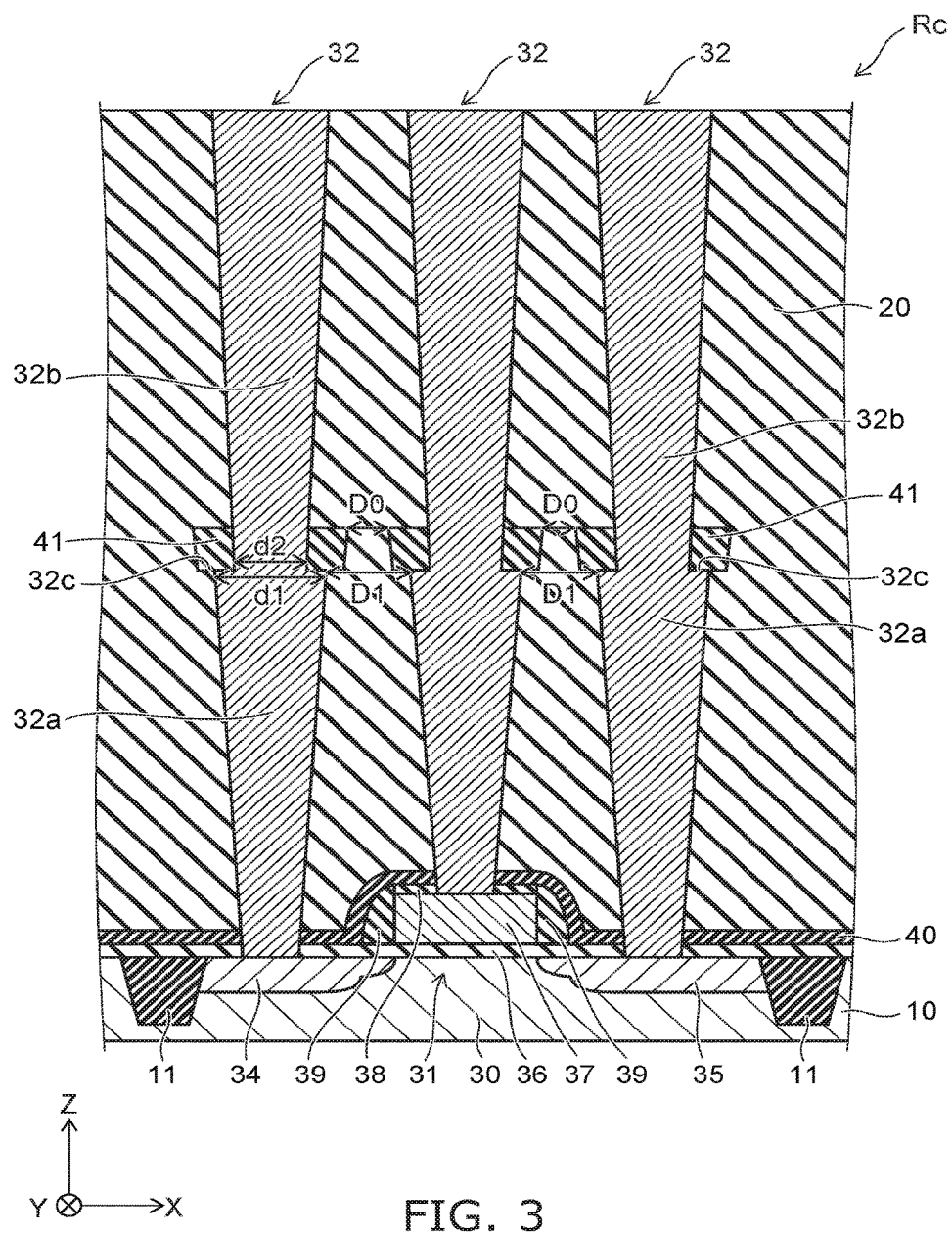
FIG. 3 is a cross-sectional view showing the peripheral circuit region of the integrated circuit device according to the first embodiment.

FIG. 3 is a cross-sectional view showing the peripheral circuit region of the integrated circuit device according to the embodiment.

FIG. 1 is a drawing showing a schematic configuration of the entire integrated circuit device; and a detailed configuration is not illustrated.

The integrated circuit device according to the embodiment is a stacked nonvolatile semiconductor memory device.

First, the configuration of the integrated circuit device 1 (hereinbelow, also called simply the "device 1") according to the embodiment will be described summarily.

As shown in FIG. 1, a silicon substrate 10 is provided in the device 1. The silicon substrate 10 is made of, for example, monocrystalline silicon. STI (Shallow Trench Isolation (an element-separating insulating film)) 11 that is made of, for example, silicon oxide (SiO) is selectively provided in the upper layer portion of the silicon substrate 10. A memory region Rm and a peripheral circuit region Rc are set in the device 1. A stacked body 15 is provided on the silicon substrate 10 in the memory region Rm. An inter-layer insulating film 20 that is made of, for example, silicon oxide is provided on the silicon substrate 10 to cover the stacked body 15.

In the specification hereinbelow, an XYZ orthogonal coordinate system is employed for convenience of description. Two mutually-orthogonal directions parallel to an upper surface 10a of the silicon substrate 10 are taken as an "X-direction" and a "Y-direction;" and a direction perpendicular to the upper surface 10a is taken as a "Z-direction." For convenience of description in the specification, a direction of the Z-directions from the silicon substrate 10 toward the inter-layer insulating film 20 also is called "up;" and the reverse direction also is called "down." However, these notations are for convenience and are independent of the direction of gravity.

In the stacked body 15, a silicon oxide film 12 and an electrode film 13 are stacked alternately along the Z-direction. In the specification, "silicon oxide film" refers to a film having silicon oxide as a major component. Accordingly, the silicon oxide film 12 includes silicon (Si) and oxygen (O). Also, because silicon oxide generally is an insulating material, the silicon oxide film is an insulating film unless otherwise indicated. This is similar for the other constituents as well; and in the case where the material name is included in the name of the constituent, the material is a major component of the constituent. For example, the electrode film 13 is formed of tungsten (W).

Multiple columnar members 17 are provided in the X-direction central portion of the stacked body 15. Each of the columnar members 17 extends in the Z-direction and pierces the stacked body 15. The configuration of the columnar member 17 is a substantially truncated circular cone that is finer downward. An epitaxial silicon layer (not illustrated) is provided at the lower end portion of the columnar member 17. The epitaxial silicon layer is connected to the silicon substrate 10. A core member that is insulative is provided in a portion of the columnar member 17 other than the epitaxial silicon layer; and a channel layer, a tunneling insulating layer, a charge storage layer, and a blocking insulating layer are provided in this order around the core member. A plug 18 is provided on the columnar member 17. The upper end of the plug 18 is connected to a bit line (not illustrated) extending in the Y-direction.

The configurations of the two X-direction end portions of the stacked body 15 are staircase configurations in which a terrace 19 is formed every electrode film 13. Contacts 21 are provided inside the inter-layer insulating film 20 in the regions directly above the terraces 19. The contacts 21 extend in the Z-direction and pierce the inter-layer insulating film 20. The lower ends of the contacts 21 are connected respectively to the electrode films 13.

A peripheral circuit for driving the memory region Rm is provided in the peripheral circuit region Rc. For example, in the peripheral circuit region Rc, the upper layer portion of the silicon substrate 10 is partitioned by the STI 11 to become a body region 30; and a field effect transistor 31 is provided above and in the interior of the body region 30. The transistor 31 is a portion of the peripheral circuit. Also, contacts 32 that are made of, for example, tungsten are provided inside the inter-layer insulating film 20. The contacts 32 extend in the Z-direction and are connected respectively to a source region, a drain region, and a gate electrode of the transistor 31. The configuration of the contact 32 is a two-step configuration in the embodiment.

The configuration of the peripheral circuit region Rc of the device 1 will now be described in detail.

As shown in FIG. 2 and FIG. 3, the upper layer portion of the silicon substrate 10 in the peripheral circuit region Rc is partitioned into the body region 30 by the STI 11. A source region 34 and a drain region 35 are formed inside the body region 30 to be separated from each other in the X-direction. A gate insulating film 36 that is made of, for example, silicon oxide is provided on the body region 30; and a gate electrode 37 that is made of, for example, polysilicon is provided on the gate insulating film 36.

An insulating film 38 that is made of, for example, silicon oxide is provided on the gate electrode 37; and a sidewall 39 that is made of, for example, silicon oxide is provided on the side surface of the gate electrode 37. The transistor 31 includes the body region 30, the source region 34, the drain region 35, the gate insulating film 36, the gate electrode 37, the insulating film 38, and the sidewall 39. A silicon nitride film 40 is provided to cover the gate insulating film 36, the insulating film 38, and the sidewall 39. The inter-layer insulating film 20 is provided on the silicon nitride film 40. For convenience of illustration in FIG. 2, only some of the constituents are shown; and the other constituents are not illustrated. For example, the inter-layer insulating film 20 is not illustrated in FIG. 2. This is similar for FIG. 14 and FIG. 16 described below as well.

The lower end of one contact 32 is connected to the source region 34; the lower end of another one contact 32 is connected to the drain region 35; and the lower end of the remaining one contact 32 is connected to the gate electrode 37.

A lower portion 32a and an upper portion 32b are provided in each of the contacts 32. The upper portion 32b is disposed on the lower portion 32a. For example, the lower portion 32a and the upper portion 32b are formed as one body of tungsten; and there is substantially no interface between the lower portion 32a and the upper portion 32b. The configurations of the lower portion 32a and the upper portion 32b each are, for example, inverted truncated circular cones that become finer downward. A diameter d1, i.e., the maximum length parallel to the XY plane, of the upper end of the lower portion 32a is larger than a diameter d2 of the lower end of the upper portion 32b. In other words, d1>d2.

Therefore, a level difference 32c is formed at the boundary portion of the side surface of the contact 32 between the lower portion 32a and the upper portion 32b. The level difference 32c is substantially parallel to the XY plane and faces upward. An insulating member 41 that has an annular configuration is provided around the lower end portion of the upper portion 32b. The composition of the insulating member 41 is different from the composition of the inter-layer insulating film 20; for example, the insulating member 41 is formed of silicon nitride (SiN). The insulating member 41 contacts the level difference 32c and the side surface of the lower end portion of the upper portion 32b. The shortest distance between the contacts 32, i.e., a shortest distance D1 between the upper end portions of the lower portions 32a, is longer than a shortest distance D0 between the insulating members 41. In other words, D1>D0.

A method for manufacturing the integrated circuit device according to the embodiment will now be described with focus on the method for forming the contacts.

FIG. 4 to FIG. 11 are cross-sectional views showing the method for manufacturing the integrated circuit device according to the embodiment.

Figure 4:
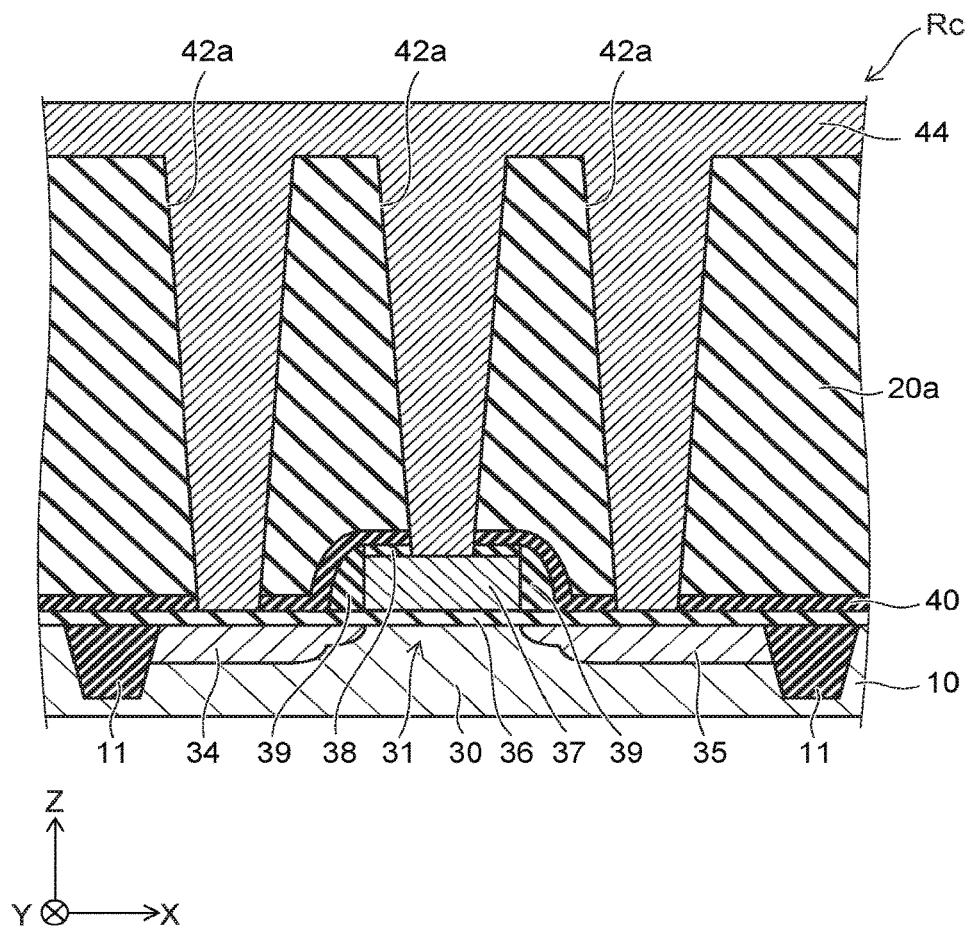
FIG. 4 to FIG. 11 are cross-sectional views showing a method for manufacturing an integrated circuit device according to the first embodiment.

First, as shown in FIG. 4, the field effect transistor 31 is formed on the upper surface of the silicon substrate 10 in the peripheral circuit region Rc by a normal method. Then, the silicon nitride film 40 is formed to cover the gate insulating film 36, the insulating film 38, and the sidewall 39 of the transistor 31. Then, for example, an inter-layer insulating film 20a is formed by depositing silicon oxide.

Continuing, for example, contact holes 42a are formed by lithography and RIE (Reactive Ion Etching) in a portion of the inter-layer insulating film 20a in the region directly above the source region 34, in a portion of the inter-layer insulating film 20a in the region directly above the drain region 35, and in a portion of the inter-layer insulating film 20a in the region directly above the gate electrode 37. At this time, the silicon nitride film 40 is used as a stopper film; and after causing the contact holes 42a to reach the upper surface of the silicon nitride film 40, the silicon nitride film 40 is removed from the bottom surfaces of the contact holes 42a; and the gate insulating film 36 is exposed. The configurations of the contact holes 42a are inverted truncated circular cones that become finer downward. Then, a sacrificial member 44 is formed by depositing amorphous silicon. The sacrificial member 44 is filled also inside the contact holes 42a.

Figure 5:
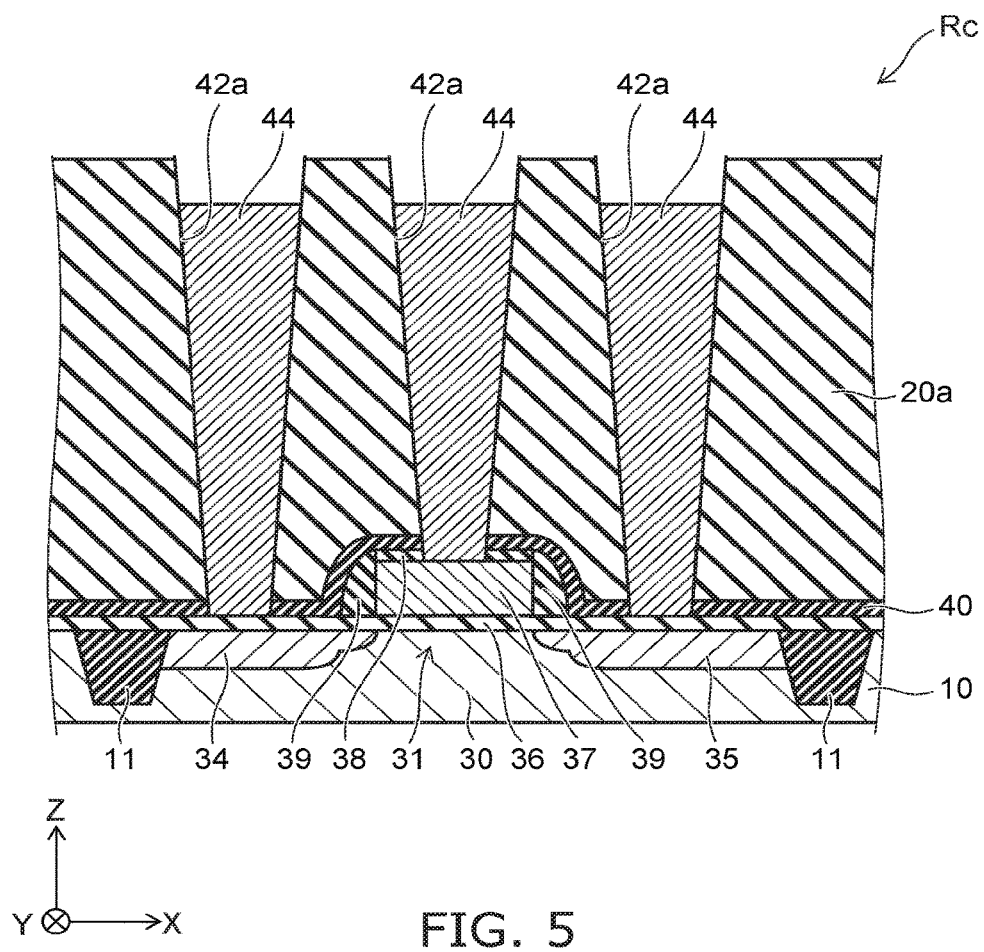

Then, as shown in FIG. 5, etch-back of the sacrificial member 44 is performed using, for example, RIE. Thereby, the sacrificial member 44 that is on the upper surface of the inter-layer insulating film 20a and inside the uppermost portions of the contact holes 42a is removed.

Figure 6:
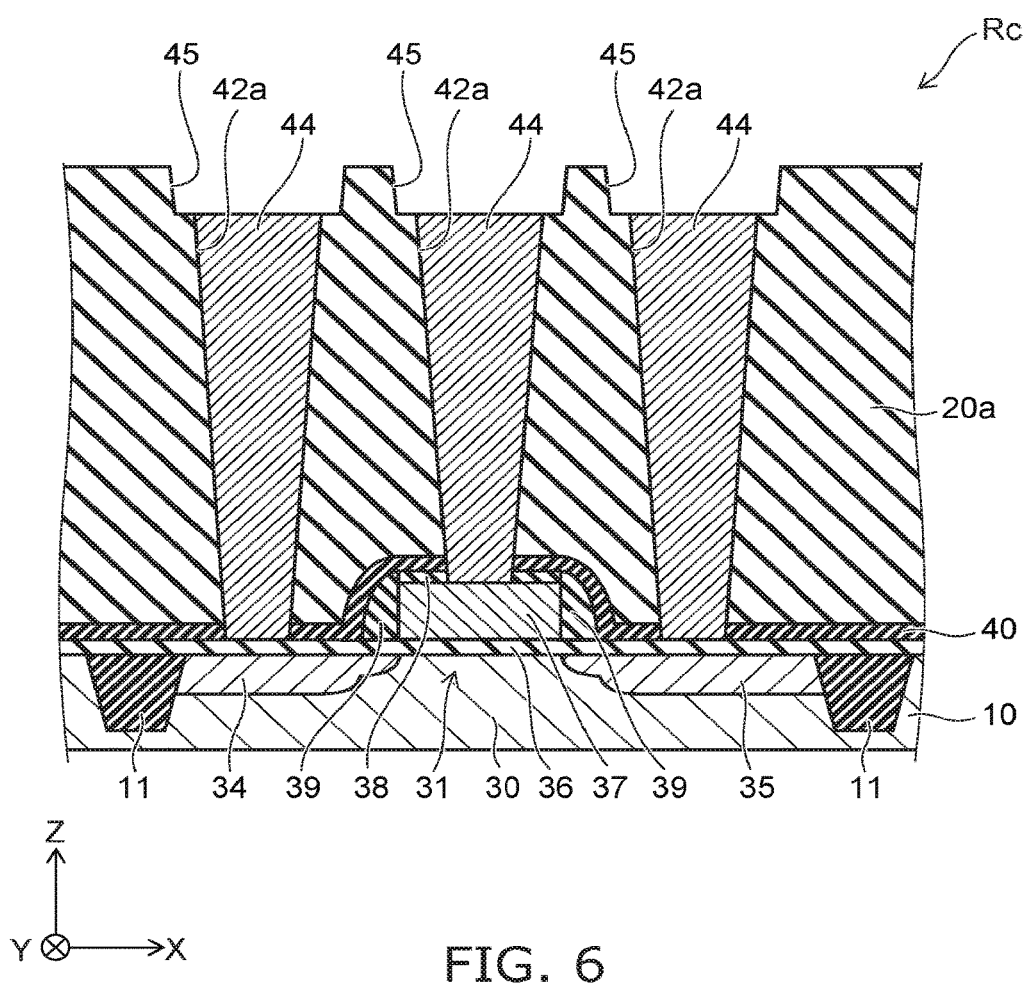

Then, as shown in FIG. 6, the inter-layer insulating film 20a is etched by performing wet etching using, for example, BHF (buffered hydrofluoric acid) as the etchant. Thereby, the uppermost portions of the contact holes 42a, i.e., the portions not filled with the sacrificial member 44, are enlarged along the XY plane to form recesses 45 having substantially disc configurations. When viewed from the Z-direction, the diameters of the recesses 45 are larger than the diameters of the contact holes 42a. The upper layer portion of the inter-layer insulating film 20a also is etched somewhat by the etching.

Figure 7:
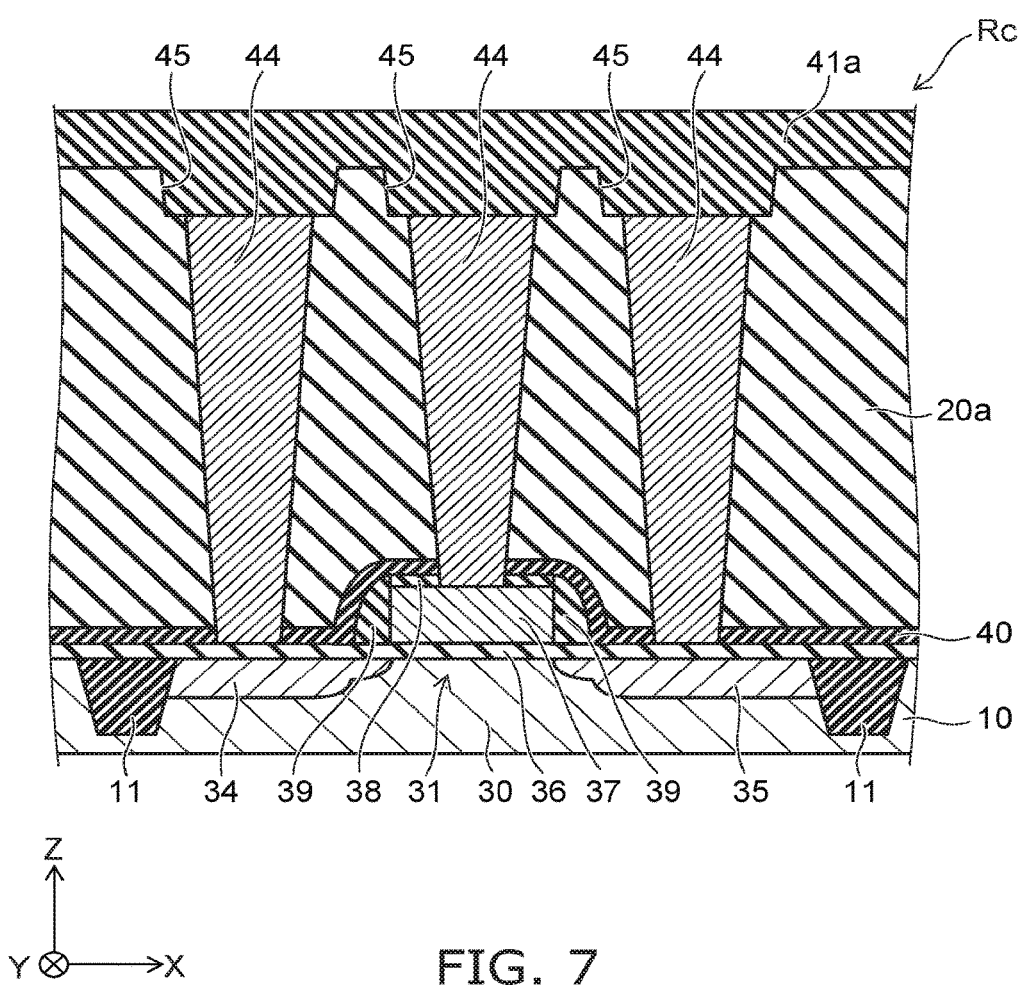

Continuing as shown in FIG. 7, an insulating film 41a is formed on the inter-layer insulating film 20a by depositing an insulating material, e.g., silicon nitride, that is different from the material of the inter-layer insulating film 20a. The insulating film 41a is filled also into the recesses 45.

Figure 8:
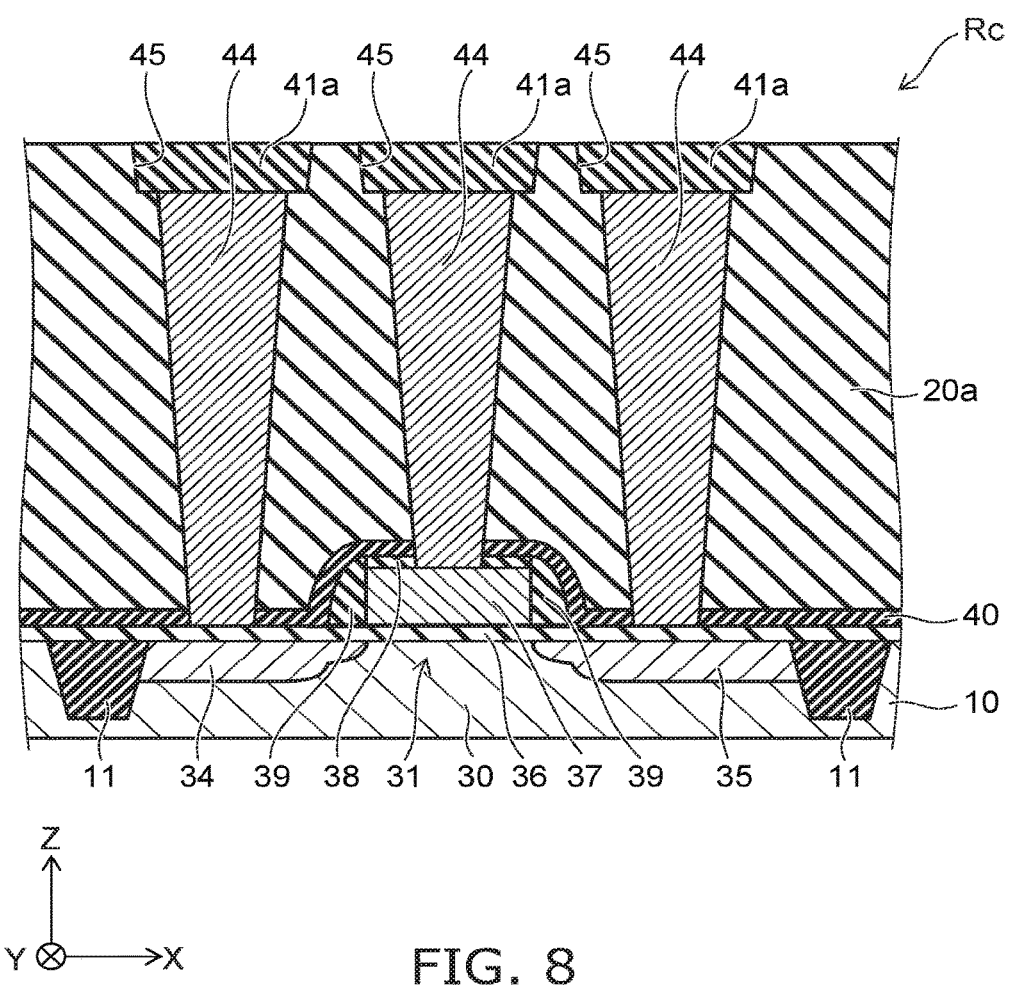

Then, as shown in FIG. 8, the portion of the insulating film 41a deposited outside the recesses 45 is removed by performing planarization such as CMP (Chemical Mechanical Polishing), etc. Thereby, the insulating film 41a remains only inside the recesses 45.

Figure 9:
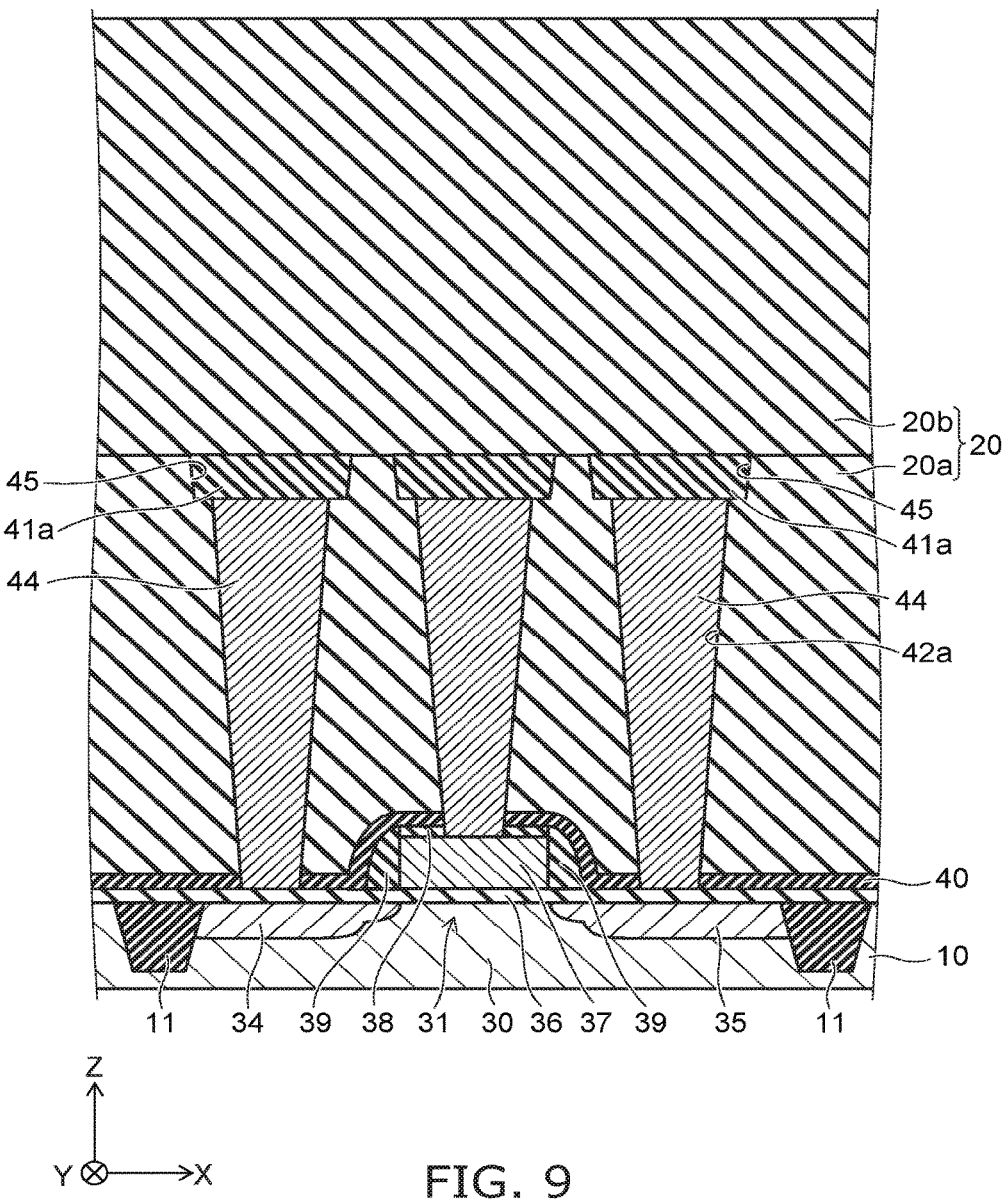

Then, as shown in FIG. 9, an inter-layer insulating film 20b is formed on the inter-layer insulating film 20a by depositing silicon oxide on the entire surface. The inter-layer insulating film 20 is formed of the inter-layer insulating film 20a and the inter-layer insulating film 20b.

Figure 10:
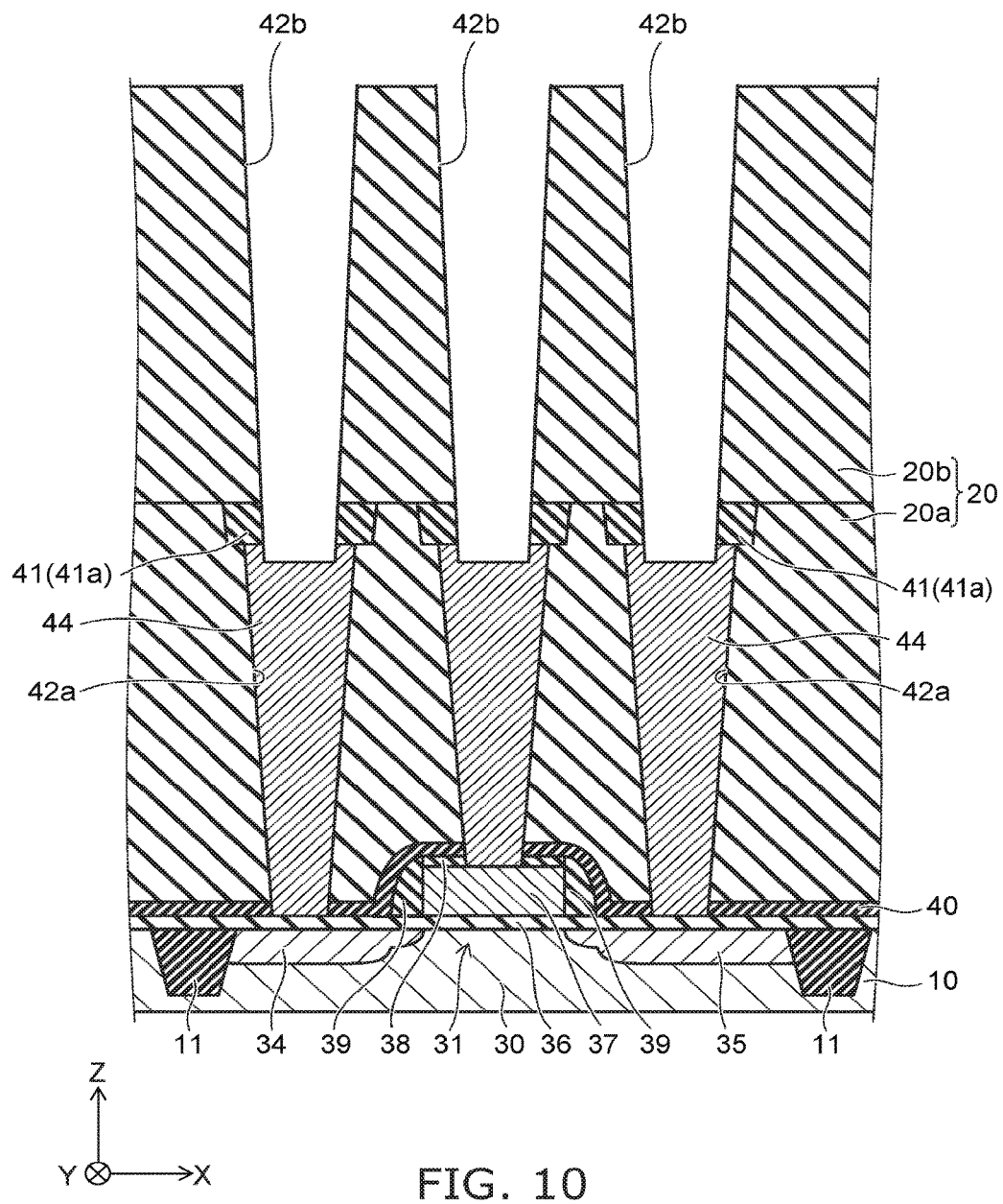

Continuing as shown in FIG. 10, contact holes 42b are formed by, for example, lithography and RIE in portions of the inter-layer insulating film 20b corresponding to the regions directly above the contact holes 42a. At this time, the etching is performed using conditions such that the etching rate of the silicon oxide is higher than the etching rate of the silicon nitride. Thereby, the etching rate decreases when the contact holes 42b reach the insulating film 41a. Then, etching is performed using conditions such that the etching rate of the silicon nitride is higher than the etching rate of the silicon oxide; and the contact holes 42b are caused to pierce the insulating film 41a and reach the upper portions of the sacrificial member 44. At this time, the insulating film 41a that has the substantially disc configurations is pierced by the contact holes 42b to become the insulating members 41 having the annular configurations.

Figure 11:
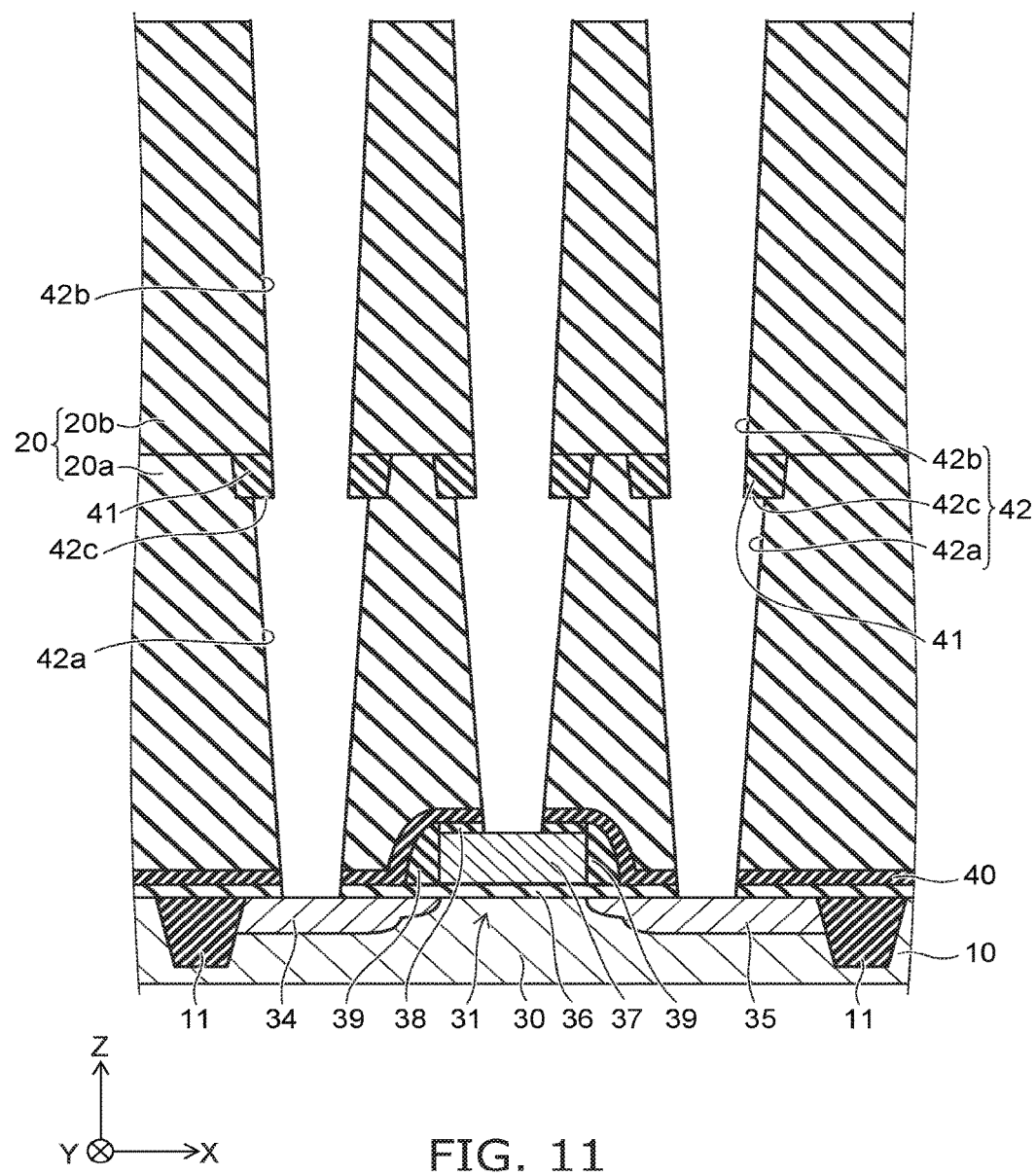

Then, as shown in FIG. 11, the sacrificial member 44 that is made of amorphous silicon is removed via the contact holes 42b by performing wet etching using, for example, TMY (choline aqueous solution) as the etchant. At this time, the inter-layer insulating film 20 that is made of silicon oxide and the insulating member 41 that is made of silicon nitride remain. Then, the gate insulating film 36 at the bottom surfaces of the contact holes 42a is removed. Thereby, the contact holes 42b that are formed inside the inter-layer insulating film 20b communicate with the contact holes 42a formed inside the inter-layer insulating film 20a to become contact holes 42 respectively reaching the source region 34, the drain region 35, and the gate electrode 37. A level difference 42c is formed in the boundary portion of the side surface of the contact hole 42 between the contact hole 42a and the contact hole 42b. The lower surface of the insulating member 41 is exposed at the level difference 42c.

Then, as shown in FIG. 3, the contact 32 is formed by filling a metal material such as tungsten, etc., into the contact hole 42. The lower portion 32a of the contact 32 is formed inside the contact hole 42a; the upper portion 32b of the contact 32 is formed inside the contact hole 42b; and the level difference 32c of the contact 32 is formed to contact the level difference 42c. Thus, the integrated circuit device 1 according to the embodiment is manufactured.

Effects of the embodiment will now be described.

In the embodiment, because the formation of the contact hole 42 is divided into two, the contact hole 42 that has a high aspect ratio can be formed. Thereby, higher integration of the integrated circuit device 1 can be realized.

In the embodiment, in the process shown in FIG. 6, the uppermost portion of the contact hole 42a is enlarged; and the recess 45 is formed so that the diameter of the recess 45 is larger than the diameter of the contact hole 42a. Thereby, the diameter of the insulating film 41a becomes larger than the diameter of the contact hole 42a when forming the insulating film 41a inside the recess 45 in the process shown in FIG. 8. As a result, when forming the contact hole 42b in the process shown in FIG. 10, the entire contact hole 42b can be caused to reach the insulating film 41a even in the case where the central axis of the contact hole 42b is shifted from the central axis of the contact hole 42a due to an alignment shift of the lithography. Therefore, the contact hole 42b does not undesirably penetrate the inter-layer insulating film 20a when the central axis of the contact hole 42b is shifted from the central axis of the contact hole 42a. Thus, according to the embodiment, the alignment shift of the lithography when forming the contact hole 42b of the upper level is absorbed; and the integrated circuit device 1 can be manufactured stably.

In the embodiment as shown in FIG. 2 and FIG. 3, the shortest distance D1 between the contacts 32 is longer than the shortest distance D0 between the insulating members 41. Because the insulating member 41 is insulative, the parasitic capacitance between the contacts 32 is determined by the shortest distance D1 between the contacts 32. Accordingly, the parasitic capacitance between the contacts 32 can be suppressed.

If an amorphous silicon film is formed instead of the insulating film 41a in the process shown in FIG. 7, the amorphous silicon film would be undesirably removed when removing the sacrificial member 44 made of amorphous silicon in the process shown in FIG. 11. Therefore, if the contact 32 is formed by filling tungsten into the contact hole 42 as shown in FIG. 3, the shortest distance between the contacts 32 undesirably becomes D0; and the parasitic capacitance between the contacts 32 increases.

Second Embodiment

A second embodiment will now be described.

Figure 12:
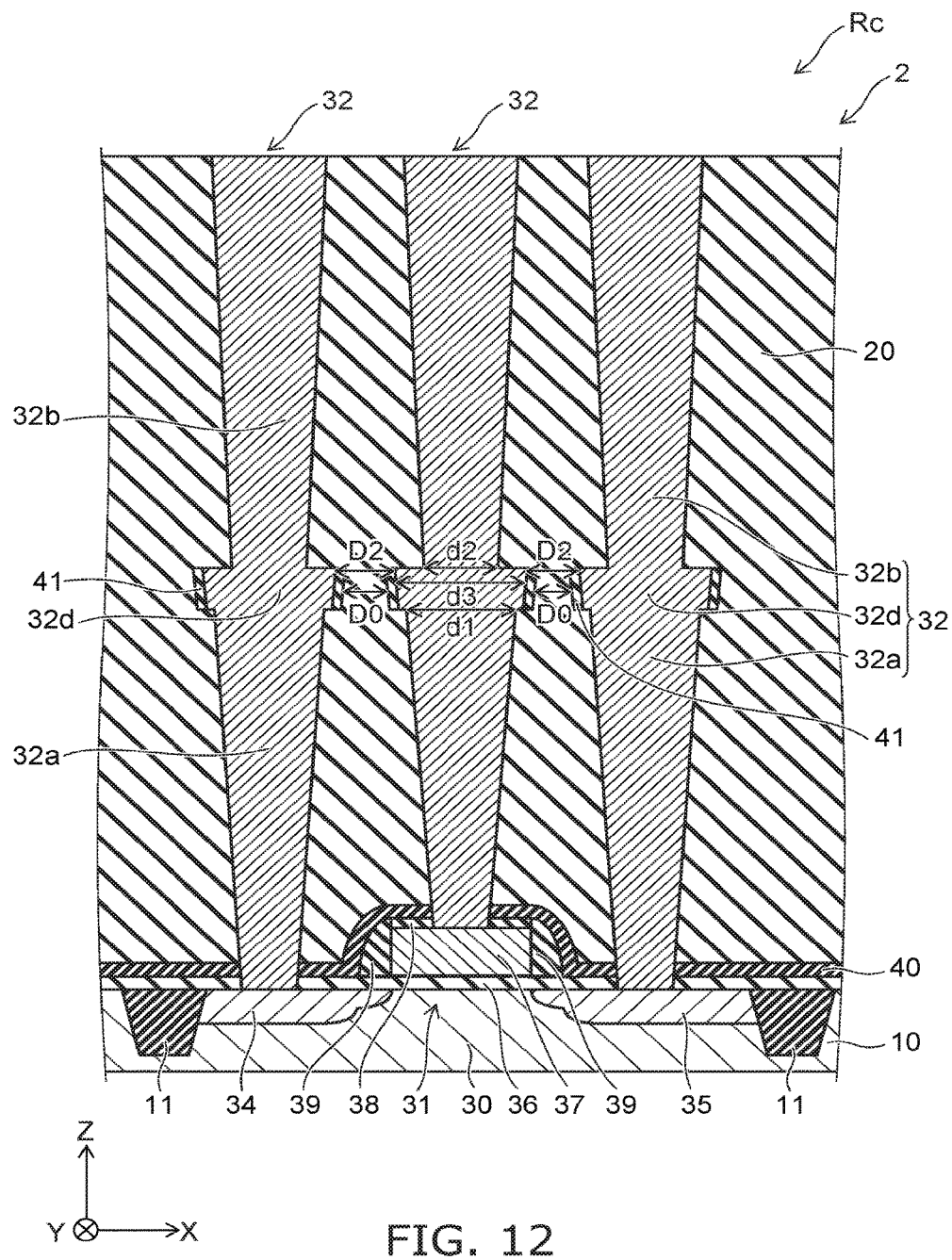
FIG. 12 is a cross-sectional view showing a peripheral circuit region of an integrated circuit device according to a second embodiment.

FIG. 12 is a cross-sectional view showing the peripheral circuit region of an integrated circuit device according to the embodiment.

In the integrated circuit device 2 according to the embodiment as shown in FIG. 12, the lower portion 32a, a middle portion 32d, and the upper portion 32b are arranged in this order along the Z-direction in each of the contacts 32. The lower portion 32a, the middle portion 32d, and the upper portion 32b are formed as one body of, for example, tungsten. In other words, there is substantially no interface between the lower portion 32a and the middle portion 32d and between the middle portion 32d and the upper portion 32b. A diameter d3, i.e., the maximum length parallel to the XY plane, of the upper end of the middle portion 32d is larger than the diameter d1 of the upper end of the lower portion 32a and larger than the diameter d2 of the lower end of the upper portion 32b. In other words, d3>d1 and d3>d2.

In the device 2, the insulating member 41 that has the annular configuration is provided on the side surface of the middle portion 32d and contacts the side surface of the middle portion 32d. The side surface of the lower portion 32a and the side surface of the upper portion 32b of the contact 32 contact the inter-layer insulating film 20. The shortest distance between the contacts 32 is a shortest distance D2 between the middle portions 32d. The shortest distance D2 is longer than the shortest distance D0 between the insulating members 41. In other words, D2>D0.

A method for manufacturing the integrated circuit device according to the embodiment will now be described.

Figure 13:
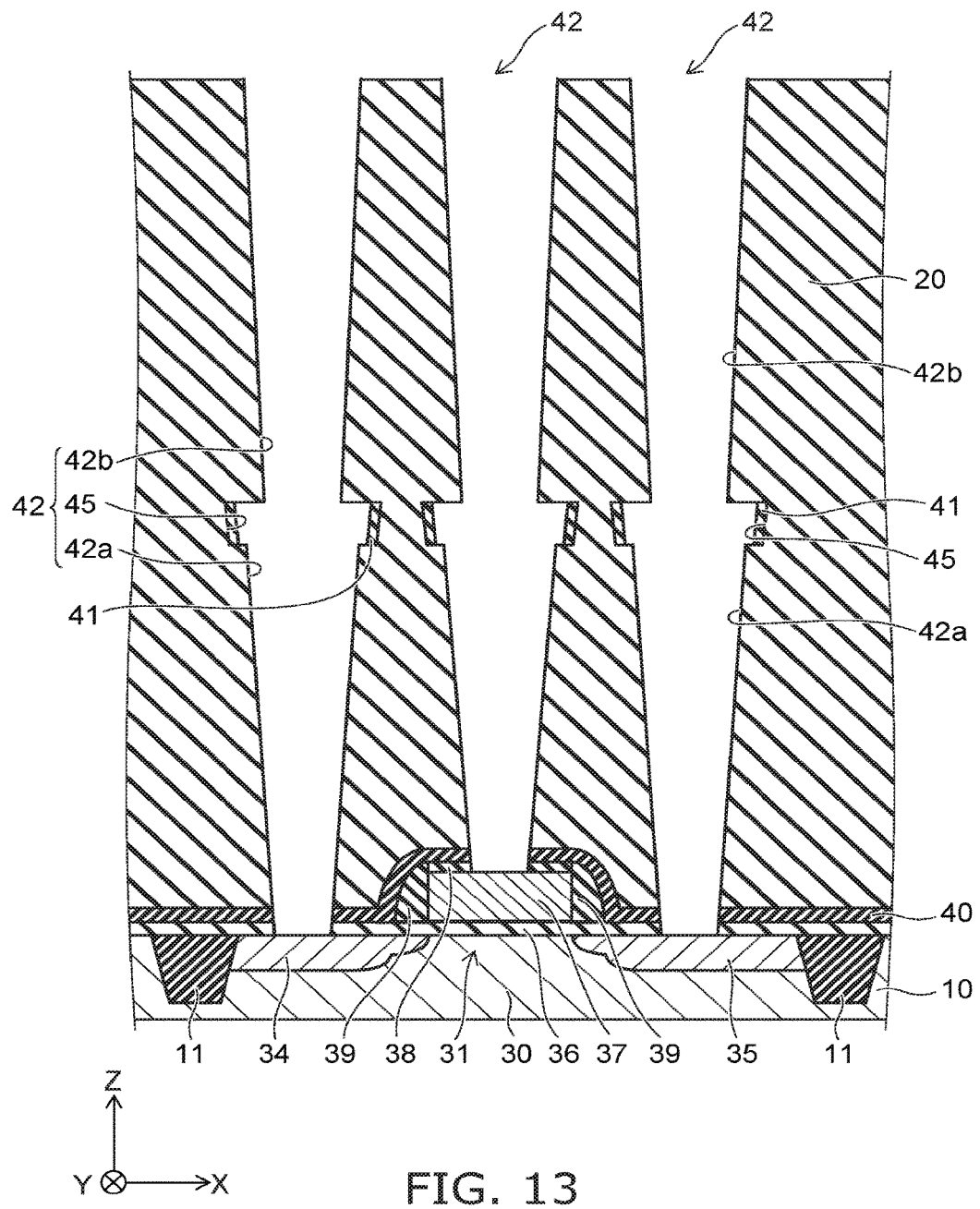
FIG. 13 is a cross-sectional view showing a method for manufacturing an integrated circuit device according to the second embodiment.

FIG. 13 is a cross-sectional view showing the method for manufacturing the integrated circuit device according to the embodiment.

First, the processes shown in FIG. 4 to FIG. 11 are implemented.

Then, as shown in FIG. 13, the inner surface of the insulating member 41 having the annular configuration is etched. For example, in the case where the insulating member 41 is formed of silicon nitride, wet etching is performed using hot phosphoric acid. Thereby, the insulating member 41 is recessed from the inner side and remains only at the outer perimeter portion, i.e., the outer side of the region directly above the contact hole 42a, of the recess 45.

Then, as shown in FIG. 12, a metal material such as tungsten or the like is filled into the contact hole 42. Thereby, the contact 32 is formed. At this time, the middle portion 32d of the contact 32 is formed inside the portion inside the recess 45 where the insulating member 41 is removed. Thus, the integrated circuit device 2 according to the embodiment is manufactured.

Effects of the embodiment will now be described.

According to the embodiment, the insulating member 41 is recessed from the inner side in the process shown in FIG. 13. Therefore, unlike the first embodiment described above (referring to FIG. 11), the insulating member 41 does not protrude from the inner surface of the contact hole 42. As a result, the penetration of the tungsten is not obstructed by the insulating member 41 when filling the tungsten into the contact hole 42 in the process shown in FIG. 12; and voids are not formed easily inside the contact 32. Thereby, the reliability and the conductivity of the contact 32 can be improved further.

Otherwise, the configuration, the manufacturing method, and the effects of the embodiment are similar to those of the first embodiment described above.

First Modification of Second Embodiment

A first modification of the second embodiment will now be described.

Figure 14:
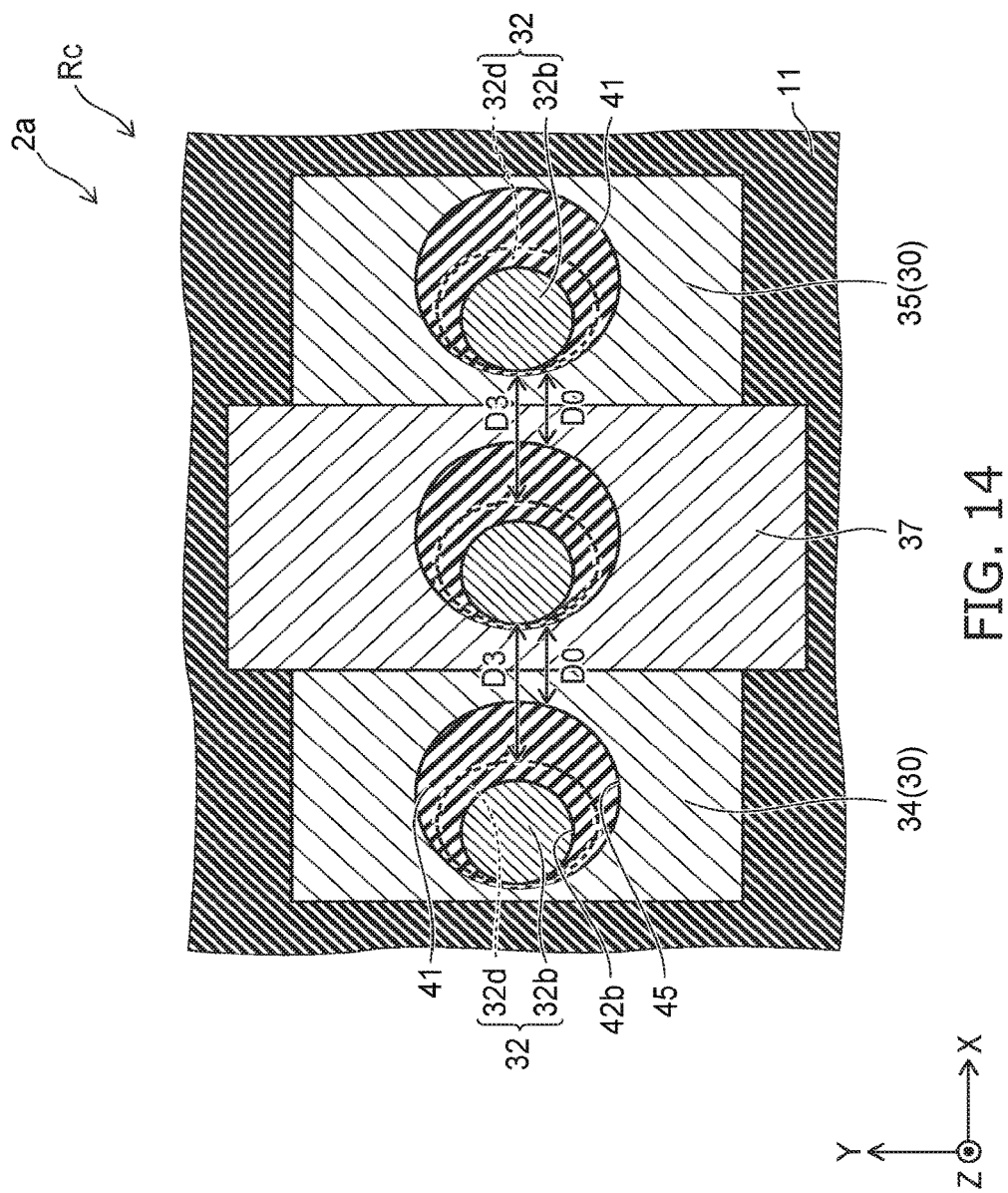
FIG. 14 is a plan view showing a peripheral circuit region of an integrated circuit device according to a first modification of the second embodiment.

FIG. 14 is a plan view showing the peripheral circuit region of an integrated circuit device according to the modification.

Figure 15:
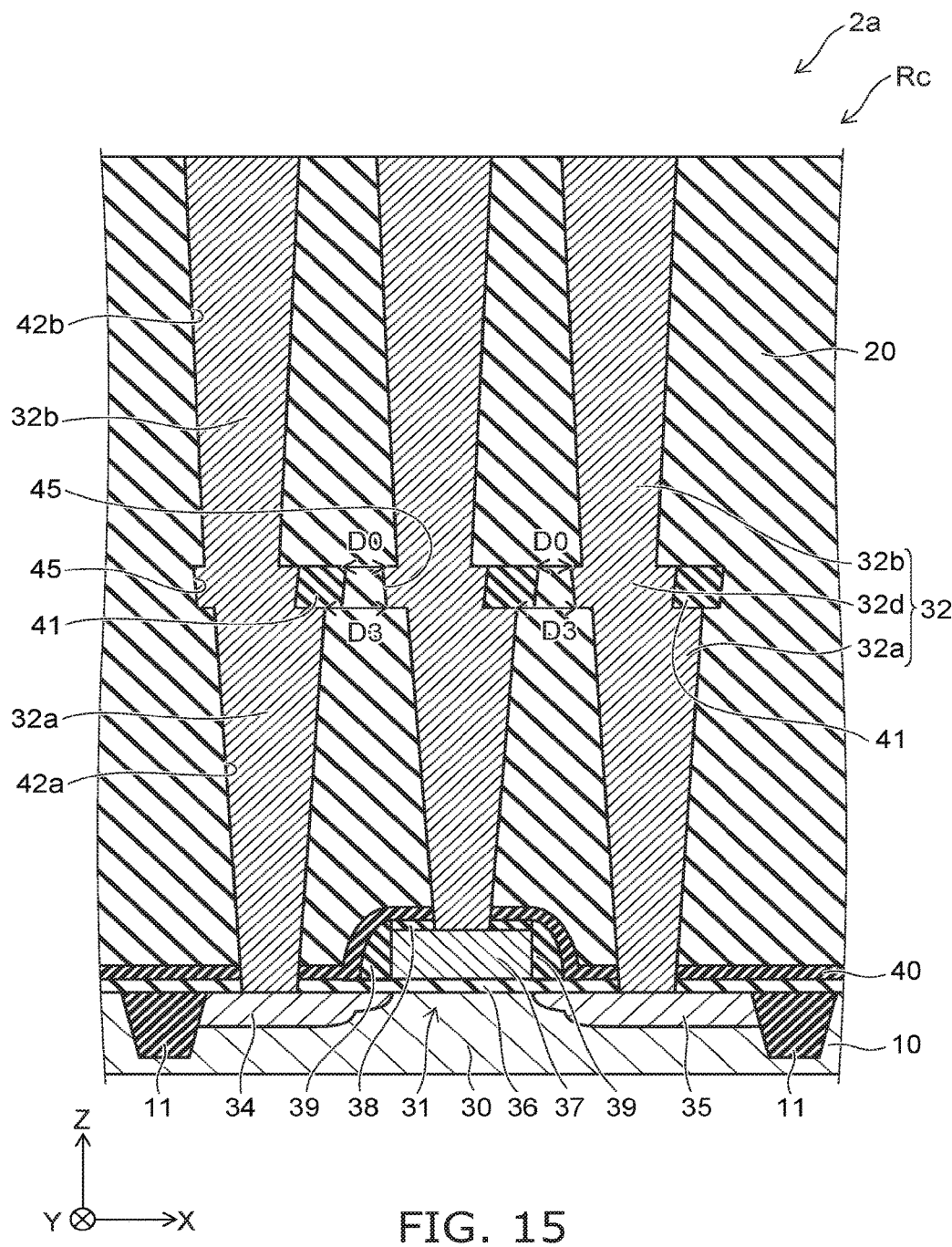
FIG. 15 is a cross-sectional view showing the peripheral circuit region of the integrated circuit device according to the first modification of the second embodiment.

FIG. 15 is a cross-sectional view showing the peripheral circuit region of the integrated circuit device according to the modification.

In the integrated circuit device 2a according to the modification as shown in FIG. 14 and FIG. 15, compared to the integrated circuit device 2 according to the second embodiment described above (referring to FIG. 12), the upper portion 32b of the contact 32 is shifted toward the source region 34 side in the X-direction with respect to the lower portion 32a. However, the amount and direction of the shift are substantially the same between all of the contacts 32. For example, such a configuration occurs in the case where the central axes of the contact holes 42b are shifted from the central axes of the contact holes 42a due to the positional shift of the lithography in the process shown in FIG. 10.

In such a case, the insulating member 41 is etched toward the outside with the lower end of the contact hole 42b as the center when etching the insulating member 41 in the process shown in FIG. 13. Therefore, as shown in FIG. 14 and FIG. 15, the middle portion 32d of the contact 32 is displaced in conjunction with the position of the contact hole 42b. Accordingly, if the amount and direction of the shift of the central axes of the contact holes 42b with respect to the central axes of the contact holes 42a are uniform, the amount and direction of the displacement of the middle portions 32d also are uniform; and a shortest distance D3 between the middle portions 32d is longer than the shortest distance D0 between the recesses 45. In other words, D3>D0. Thereby, the distance between the contacts 32 can be ensured; and the parasitic capacitance between the contacts 32 can be reduced.

Otherwise, the configuration, the manufacturing method, and the effects according to the modification are similar to those of the second embodiment described above.

Second Modification of Second Embodiment

A second modification of the second embodiment will now be described.

Figure 16:
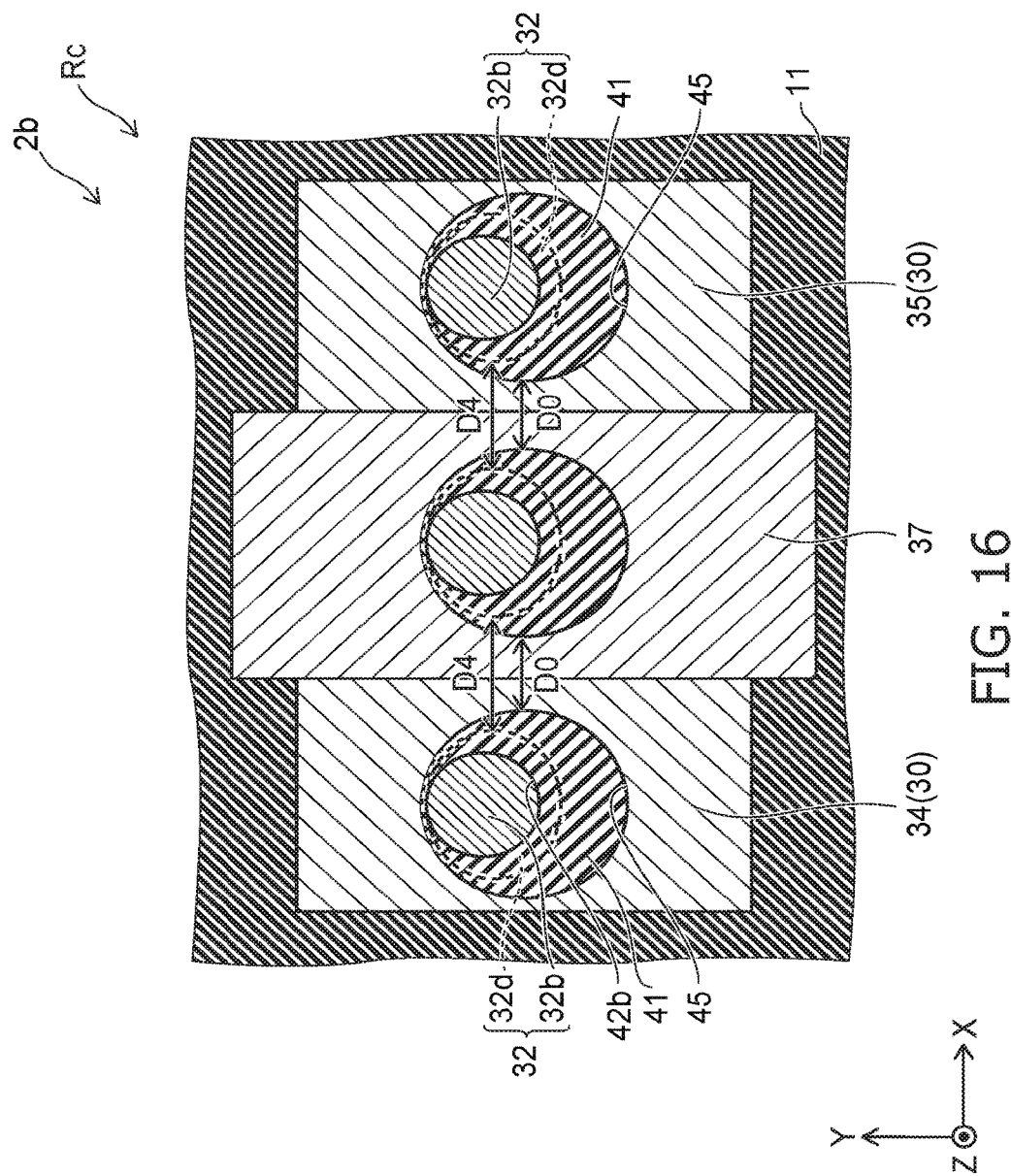
FIG. 16 is a plan view showing a peripheral circuit region of an integrated circuit device according to a second modification of the second embodiment.

FIG. 16 is a plan view showing the peripheral circuit region of an integrated circuit device according to the modification.

In the integrated circuit device 2b according to the modification as shown in FIG. 16, the upper portion 32b of the contact 32 is shifted with respect to the lower portion 32a in the Y-direction, i.e., a direction orthogonal to the direction from the source region 34 toward the drain region 35. In such a case as well, because the middle portion 32d is formed with the lower end portion of the lower portion 32b of the contact 32 as a reference, a shortest distance D4 between the contacts 32 is longer than the shortest distance D0 between the insulating members 41. In other words, D4>D0.

Otherwise, the configuration, the manufacturing method, and the effects according to the modification are similar to those of the second embodiment described above. The direction in which the contact hole 42b is shifted with respect to the contact hole 42a is not limited to the X-direction and the Y-direction and may be any direction in the XY plane.

Third Embodiment

A third embodiment will now be described.

Figure 17:
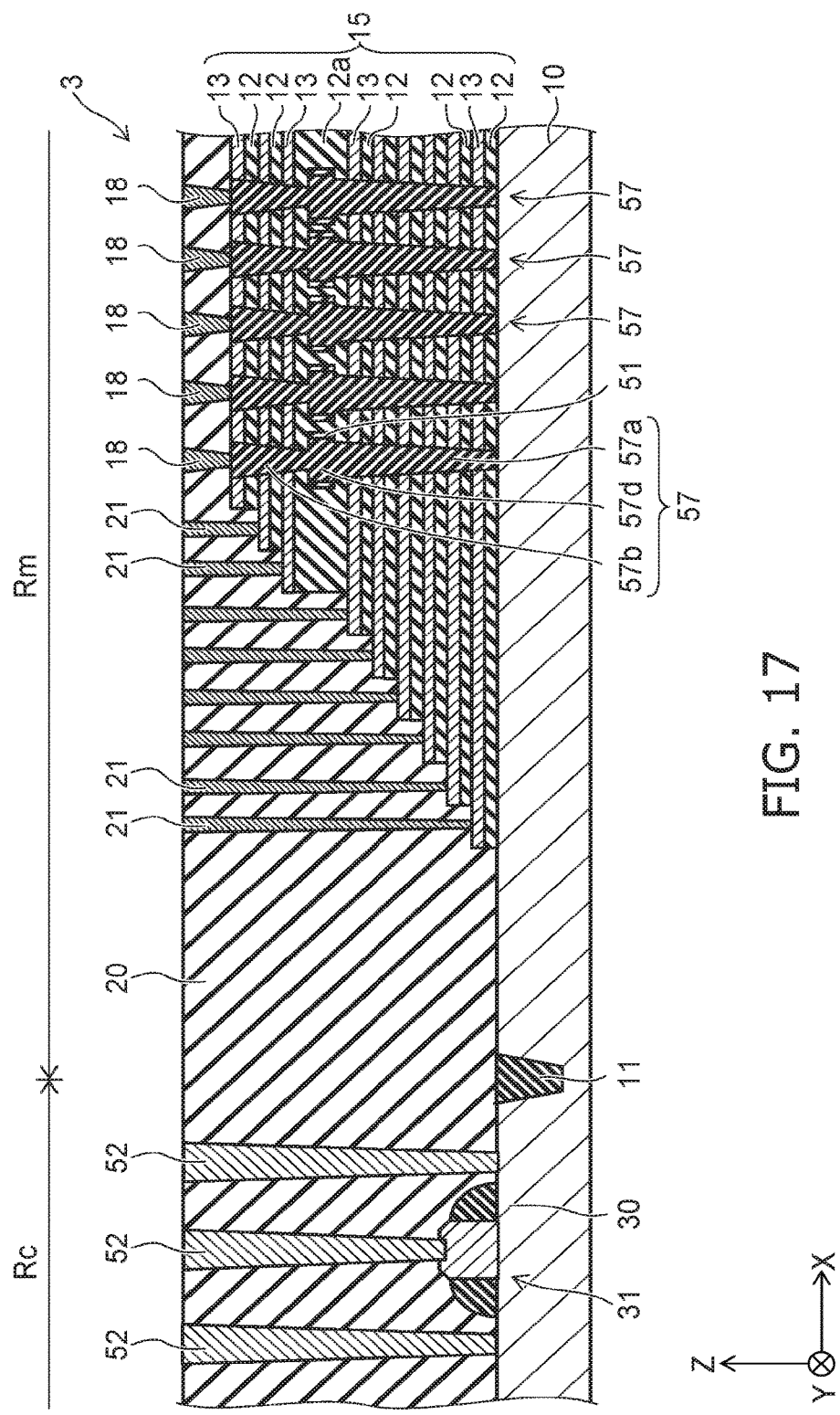
FIG. 17 is a cross-sectional view showing an integrated circuit device according to a third embodiment.

FIG. 17 is a cross-sectional view showing an integrated circuit device according to the embodiment.

Figure 18:
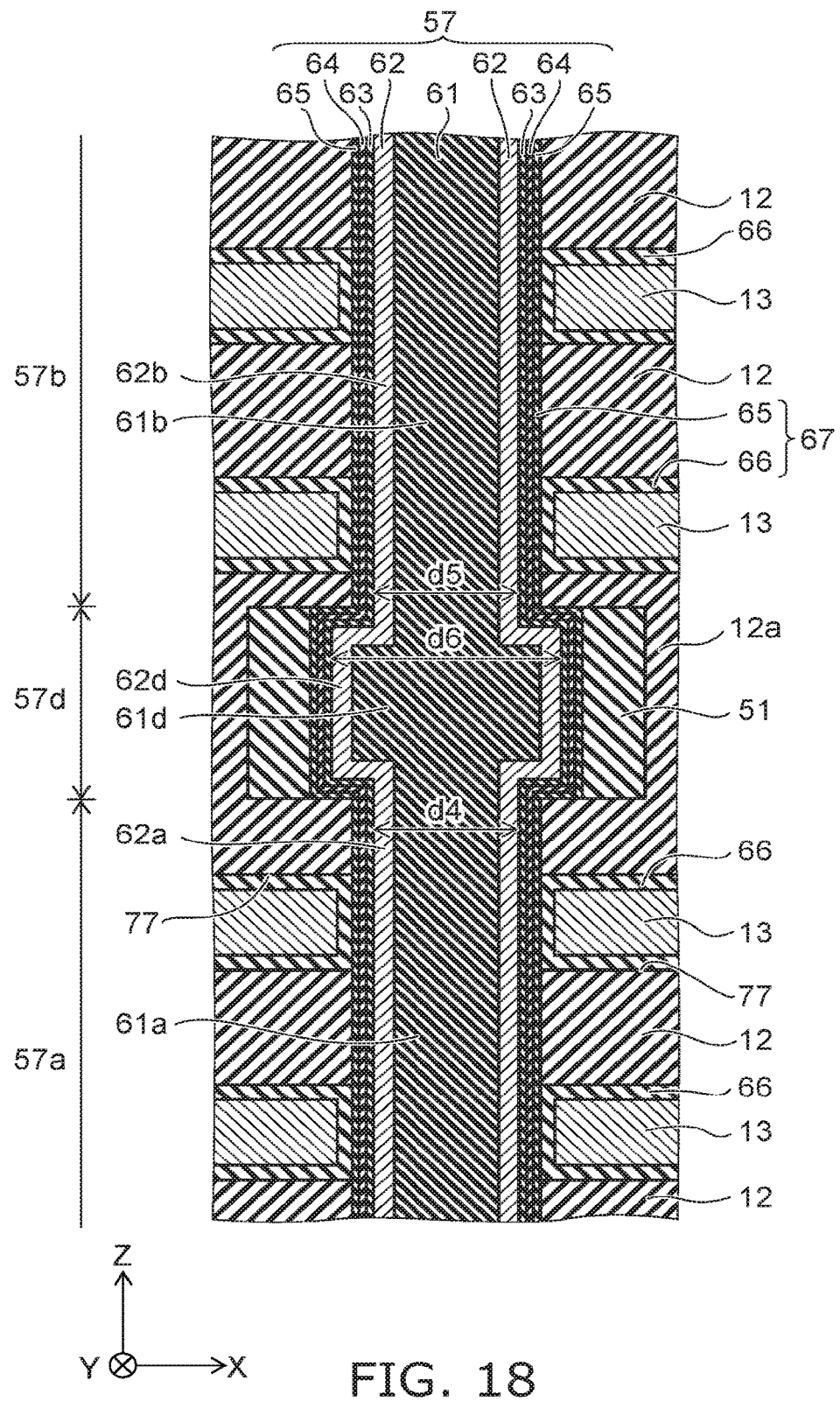
FIG. 18 is a cross-sectional view showing a columnar member of the integrated circuit device according to the third embodiment.

FIG. 18 is a cross-sectional view showing a columnar member of the integrated circuit device according to the embodiment.

The integrated circuit device according to the embodiment is a stacked nonvolatile semiconductor memory device.

As shown in FIG. 17, the integrated circuit device 3 according to the embodiment differs from the integrated circuit device 1 according to the first embodiment described above (referring to FIG. 1) in that a contact 52 is provided instead of the contact 32; and a columnar member 57 is provided instead of the columnar member 17. A level difference and a middle portion are not provided in the contact 52; and the contact 52 becomes finer continuously from the upper end portion toward the lower end portion. Also, the insulating member 41 is not provided at the periphery of the contact 52.

In the columnar member 57 as shown in FIG. 18, a core member 61 that is made of, for example, silicon oxide is provided at the center; and a silicon layer 62, a silicon oxide layer 63, a silicon nitride layer 64, and a silicon oxide layer 65 are provided in this order around the core member 61. The silicon layer 62 is a semiconductor member and functions as a channel layer. The silicon oxide layer 63 functions as a tunneling insulating film; and the silicon nitride layer 64 functions as a charge storage layer.

In the core member 61, a lower portion 61a, a middle portion 61d, and an upper portion 61b are disposed as one body in this order along the direction upward from below, i.e., away from the silicon substrate 10. The diameter of the middle portion 61d is larger than the diameter of the lower portion 61a and the diameter of the upper portion 61b. The silicon layer 62, the silicon oxide layer 63, the silicon nitride layer 64, and the silicon oxide layer 65 have substantially uniform thicknesses but are bent reflecting the configuration of the core member 61. Therefore, in the silicon layer 62 that is used as the semiconductor member, a diameter d6 of the upper end of a middle portion 62d disposed around the middle portion 61d of the core member 61 is larger than a diameter d4 of the upper end of a lower portion 62a of the silicon layer 62 disposed around the lower portion 61a of the core member 61 and is larger than a diameter d5 of the lower end of an upper portion 62b of the silicon layer 62 disposed around the upper portion 61b of the core member 61. In other words, d6>d4 and d6>d5.

A lower portion 57a of the columnar member 57 includes the silicon layer 62, the silicon oxide layer 63, the silicon nitride layer 64, and the silicon oxide layer 65 disposed at the lower portion 61a of the core member 61 and around the lower portion 61a. A middle portion 57d of the columnar member 57 includes the silicon layer 62, the silicon oxide layer 63, the silicon nitride layer 64, and the silicon oxide layer 65 disposed at the middle portion 61d of the core member 61 and around the middle portion 61d. An upper portion 57b of the columnar member 57 includes the silicon layer 62, the silicon oxide layer 63, the silicon nitride layer 64, and the silicon oxide layer 65 disposed at the upper portion 61b of the core member 61 and around the upper portion 61b. The middle portion 57d is disposed inside a silicon oxide film 12a that is thicker than the silicon oxide film 12 and does not contact the electrode film 13. An insulating member 51 that is made of, for example, silicon nitride is provided around the middle portion 57d of the columnar member 57. The configuration of the insulating member 51 is an annular configuration surrounding the middle portion 57d. The middle portion 57d and the insulating member 51 do not contact the electrode film 13.

An aluminum oxide layer 66 is provided between the electrode film 13 and the silicon oxide film 12, between the electrode film 13 and the silicon oxide film 12a, and between the electrode film 13 and the silicon oxide layer 65. A blocking insulating film 67 includes the silicon oxide layer 65 and the aluminum oxide layer 66.

In the integrated circuit device 3, a memory cell is formed, with the silicon nitride layer 64 interposed, at each crossing portion between the silicon layer 62 and the electrode film 13. The memory cells are arranged in a three-dimensional matrix configuration along the X-direction, the Y-direction, and the Z-direction.

A method for manufacturing the integrated circuit device according to the embodiment will now be described with focus on the memory region.

FIG. 19 to FIG. 29 are cross-sectional views showing the method for manufacturing the integrated circuit device according to the embodiment.

Figure 19:
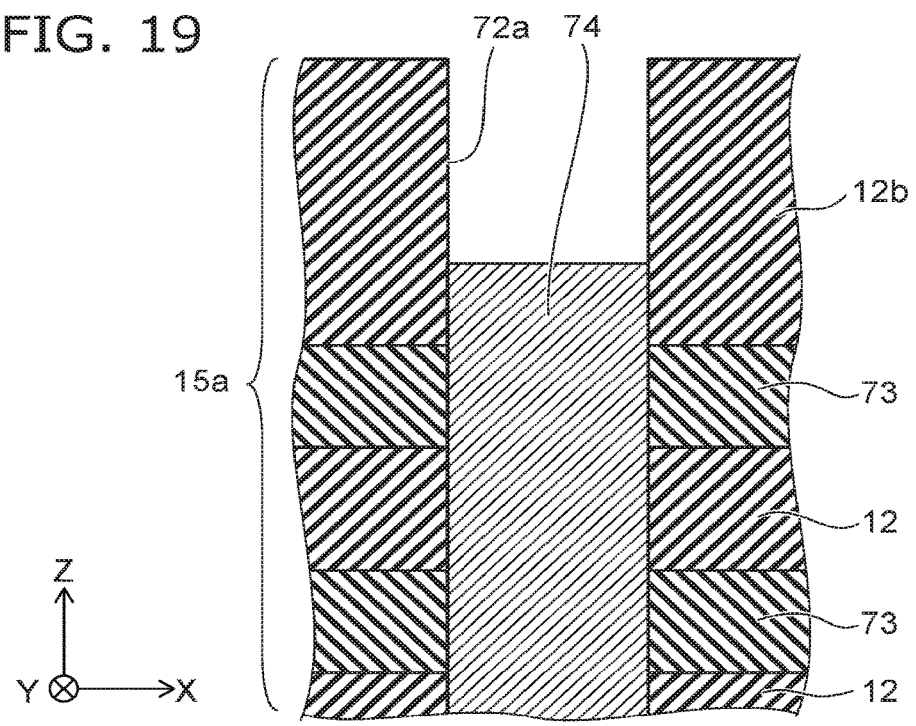
FIG. 19 to FIG. 29 are cross-sectional views showing a method for manufacturing an integrated circuit device according to the third embodiment.

First, as shown in FIG. 19, a stacked body 15a is formed by alternately stacking the silicon oxide film 12 and a silicon nitride film 73 on the silicon substrate 10 (referring to FIG. 17). At this time, the uppermost layer of the stacked body 15a is a silicon oxide film 12b. The silicon oxide film 12b is set to be thicker than the other silicon oxide films 12.

Then, multiple memory holes 72a are formed in the stacked body 15a by lithography and RIE. Continuing, an epitaxial silicon layer (not illustrated) is grown at the upper surface of the silicon substrate 10 at the bottom portions of the memory holes 72a. Then, a sacrificial member 74 is formed by depositing amorphous silicon on the entire surface. The sacrificial member 74 is filled also inside the memory holes 72a. Then, etch-back of the sacrificial member 74 is performed using, for example, RIE. Thereby, the sacrificial member 74 that is on the upper surface of the stacked body 15a is removed; and the sacrificial member 74 that is inside the uppermost portions of the memory holes 72a, i.e., the portions surrounded with the upper portion of the silicon oxide film 12b, is removed.

Figure 20:
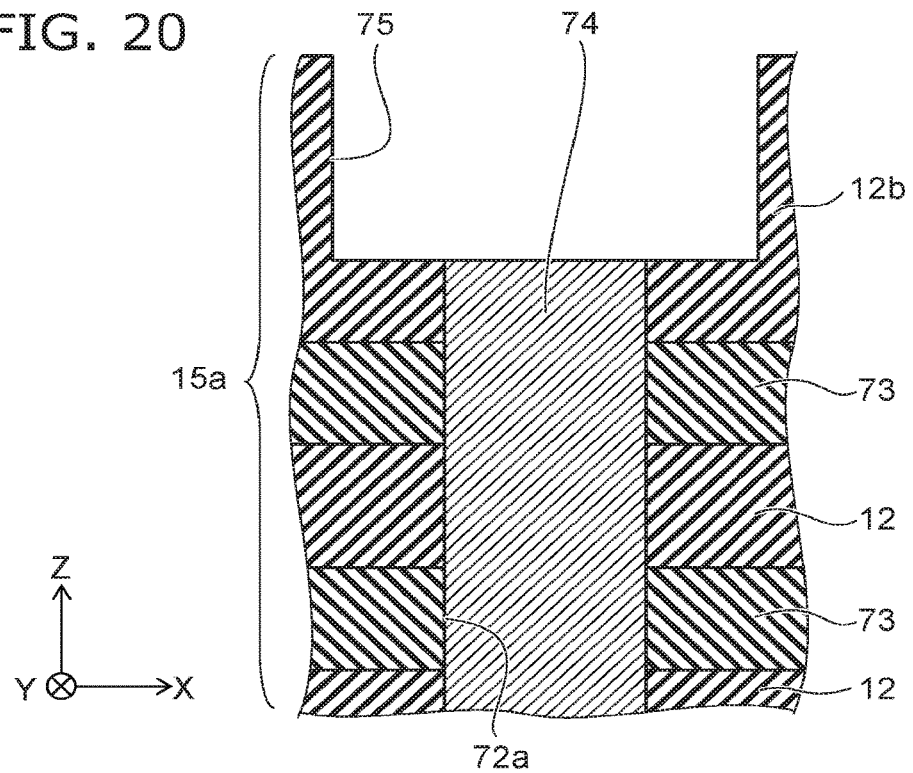

Then, as shown in FIG. 20, the silicon oxide film 12b is etched by performing, for example, wet etching. Thereby, the uppermost portion of the memory hole 72a, i.e., the portion not filled with the sacrificial member 74, spreads along the XY plane to become a recess 75 having a substantially disc configuration. When viewed from the Z-direction, the diameter of the recess 75 is larger than the diameter of the memory hole 72a. The upper layer portion of the silicon oxide film 12b also is etched somewhat by the etching.

Figure 21:
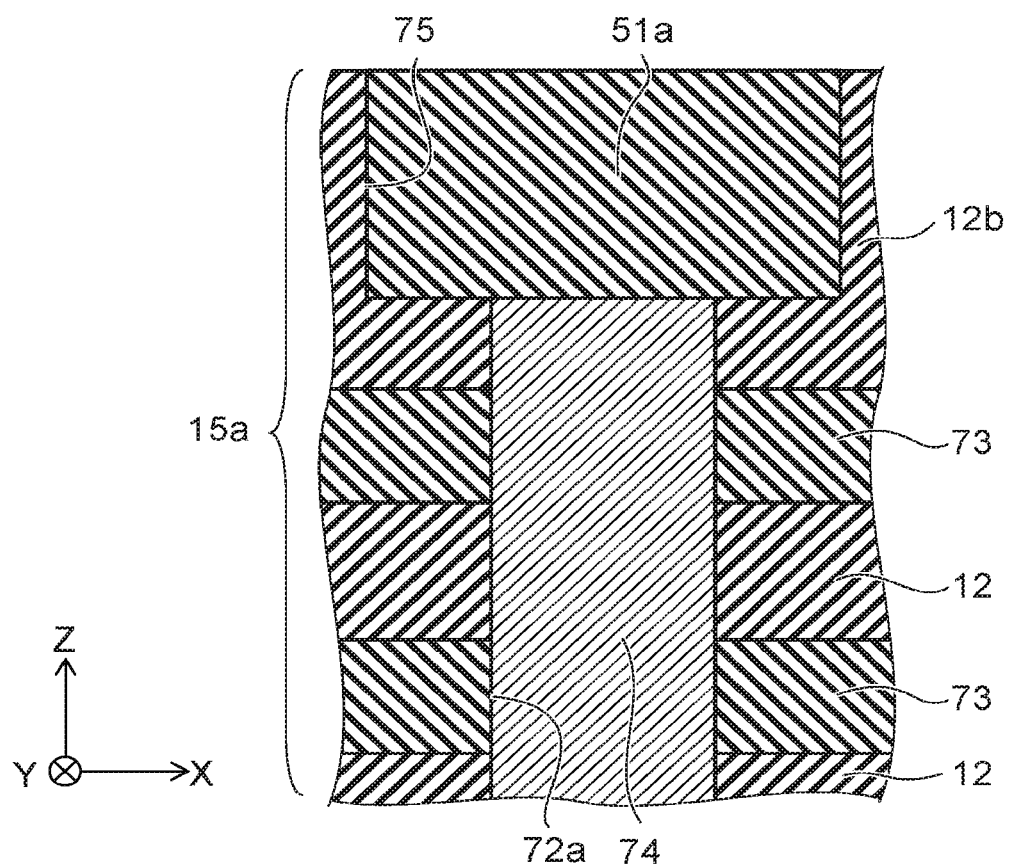

Continuing as shown in FIG. 21, an insulating film 51a is formed on the silicon oxide film 12b by depositing an insulating material, e.g., silicon nitride, that is different from the material of the silicon oxide film 12b. The insulating film 51a is filled also inside the recess 75. Then, the portion of the insulating film 51a that is deposited outside the recess 75 is removed by performing planarization such as CMP, etc. Thereby, the insulating film 51a remains only inside the recess 75.

Figure 22:
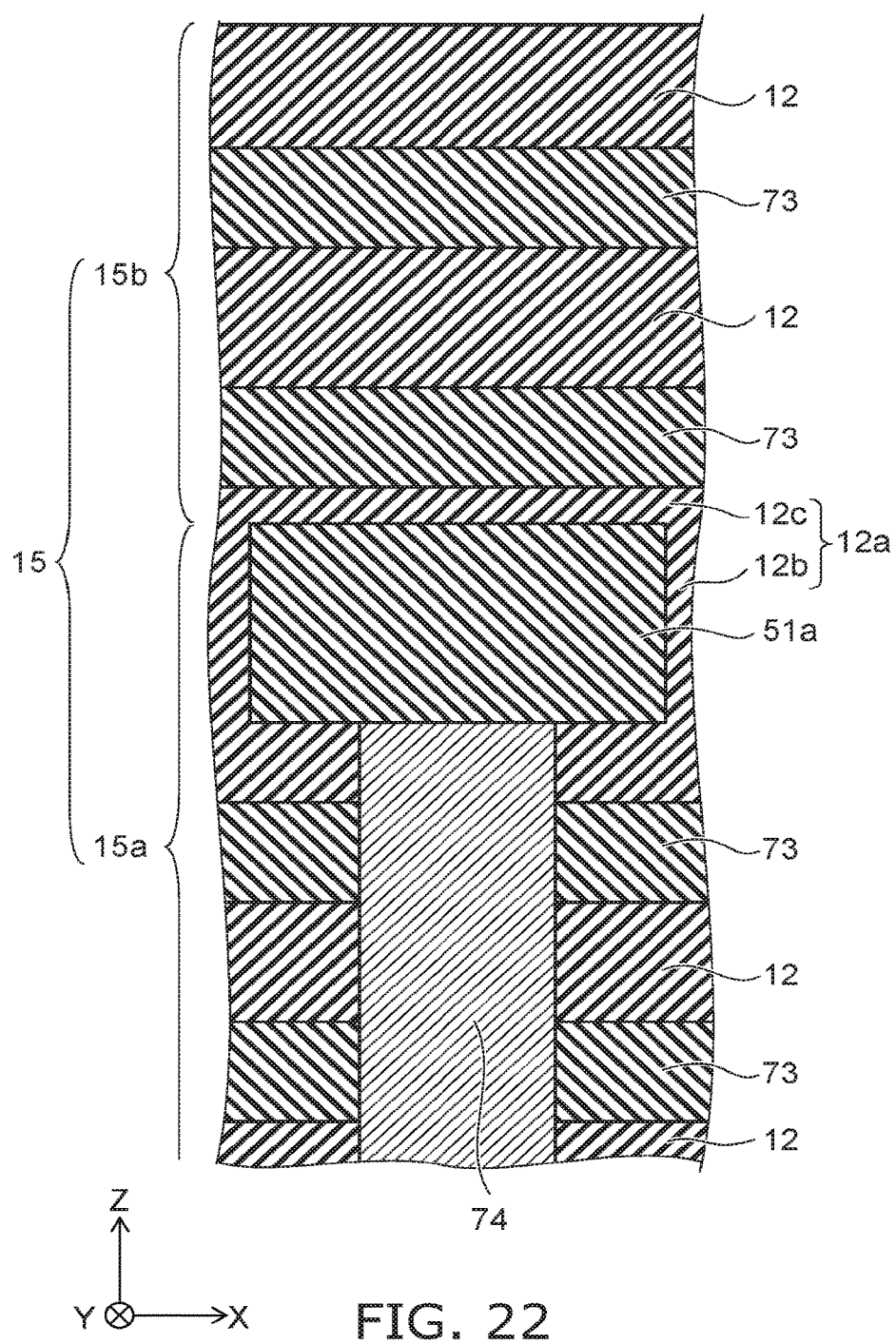

Then, as shown in FIG. 22, a silicon oxide film 12c is formed above the silicon oxide film 12b and the insulating film 51a. The silicon oxide film 12a is formed of the silicon oxide film 12b and the silicon oxide film 12c. Then, the silicon nitride film 73 and the silicon oxide film 12 are formed alternately. Thereby, a stacked body 15b is formed on the stacked body 15a. The stacked body 15 is formed of the stacked body 15a and the stacked body 15b.

Figure 23:
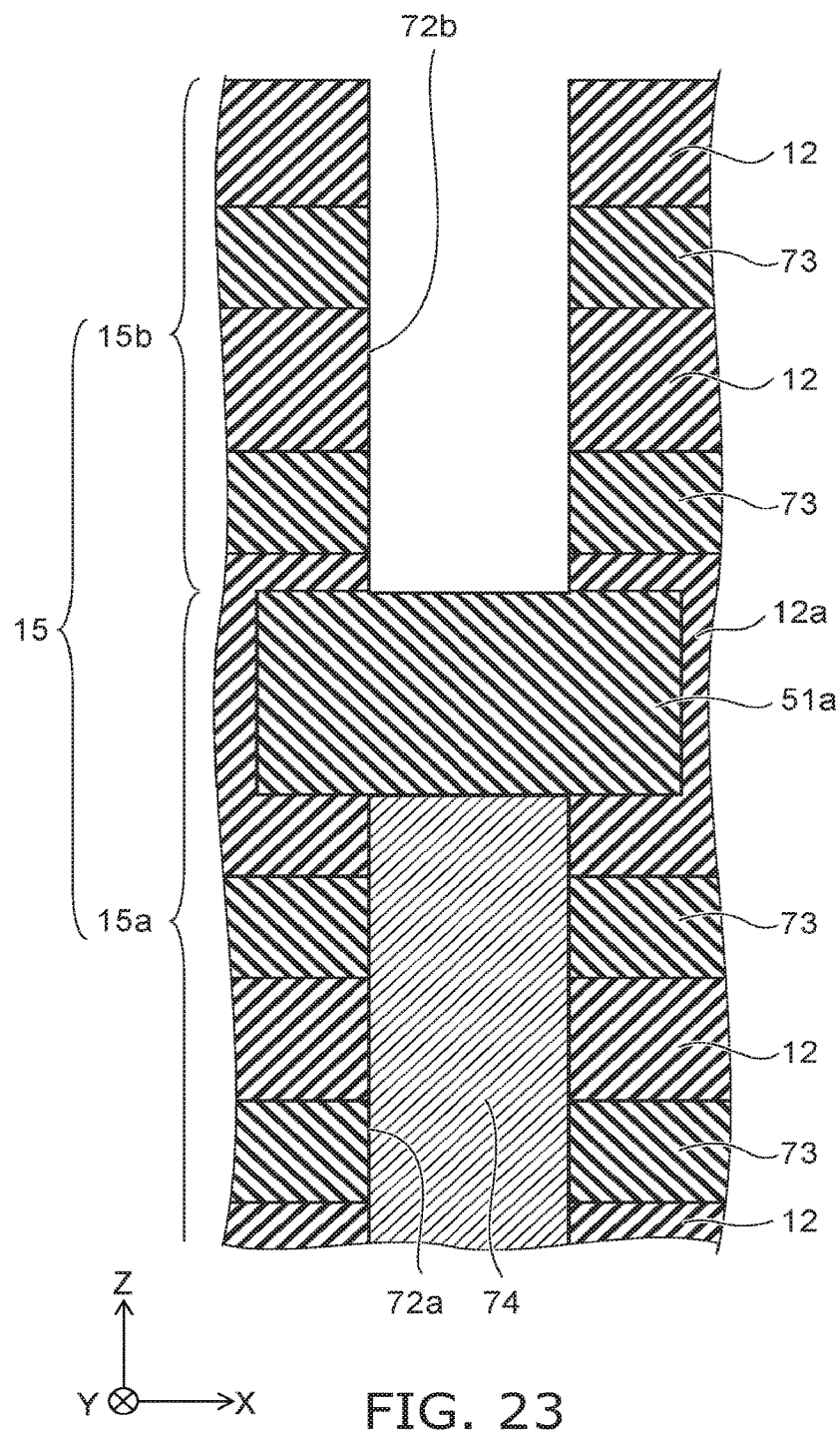

Continuing as shown in FIG. 23, a memory hole 72b is formed in the region directly above the memory hole 72a in the stacked body 15b by lithography and RIE. The memory hole 72b reaches the insulating film 51a.

Figure 24:
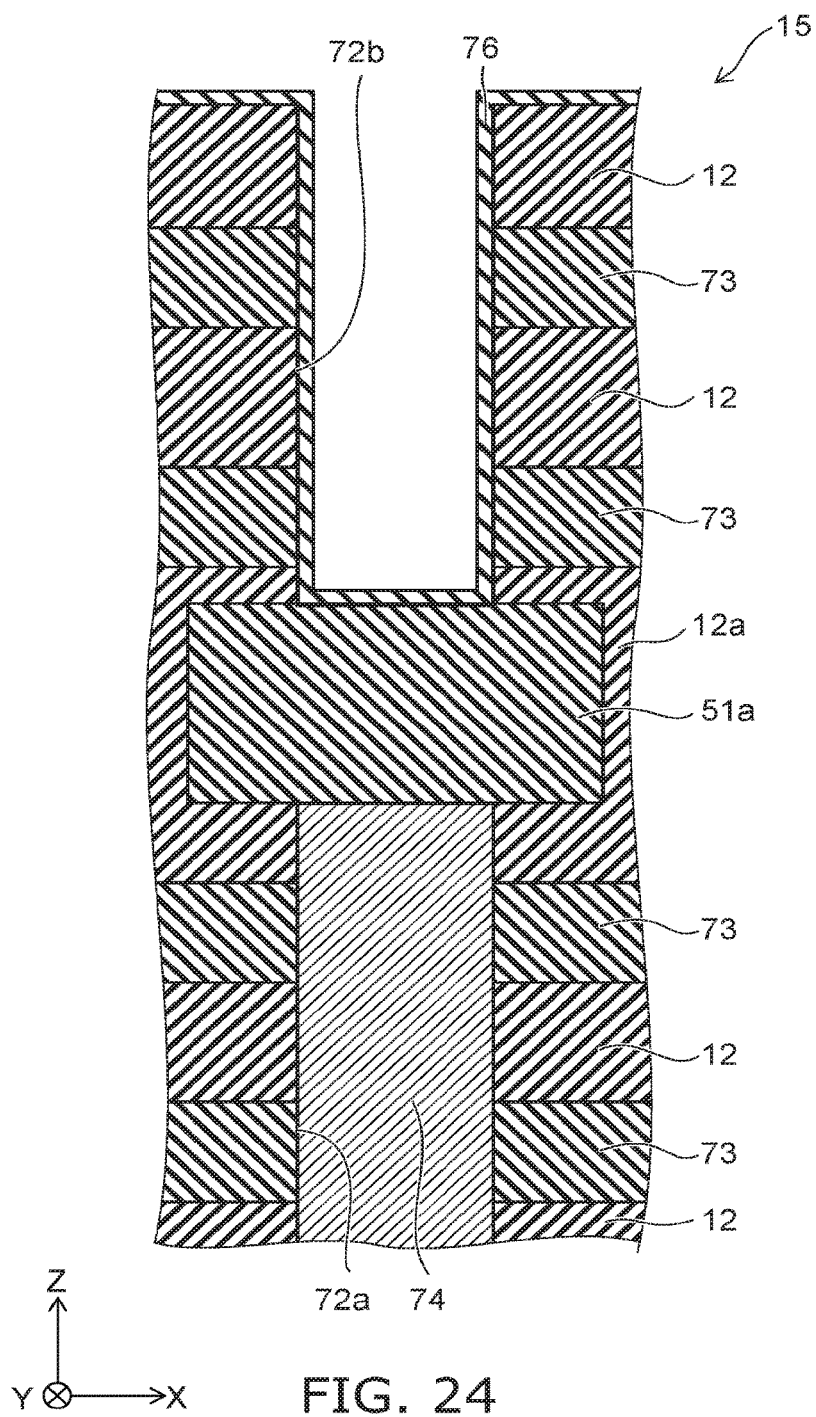

Then, as shown in FIG. 24, a protective layer 76 is formed on the inner surface of the memory hole 72b by thinly depositing silicon oxide on the entire surface. The protective layer 76 is formed also on the upper surface of the stacked body 15. The protective layer 76 may be formed of amorphous silicon.

Figure 25:
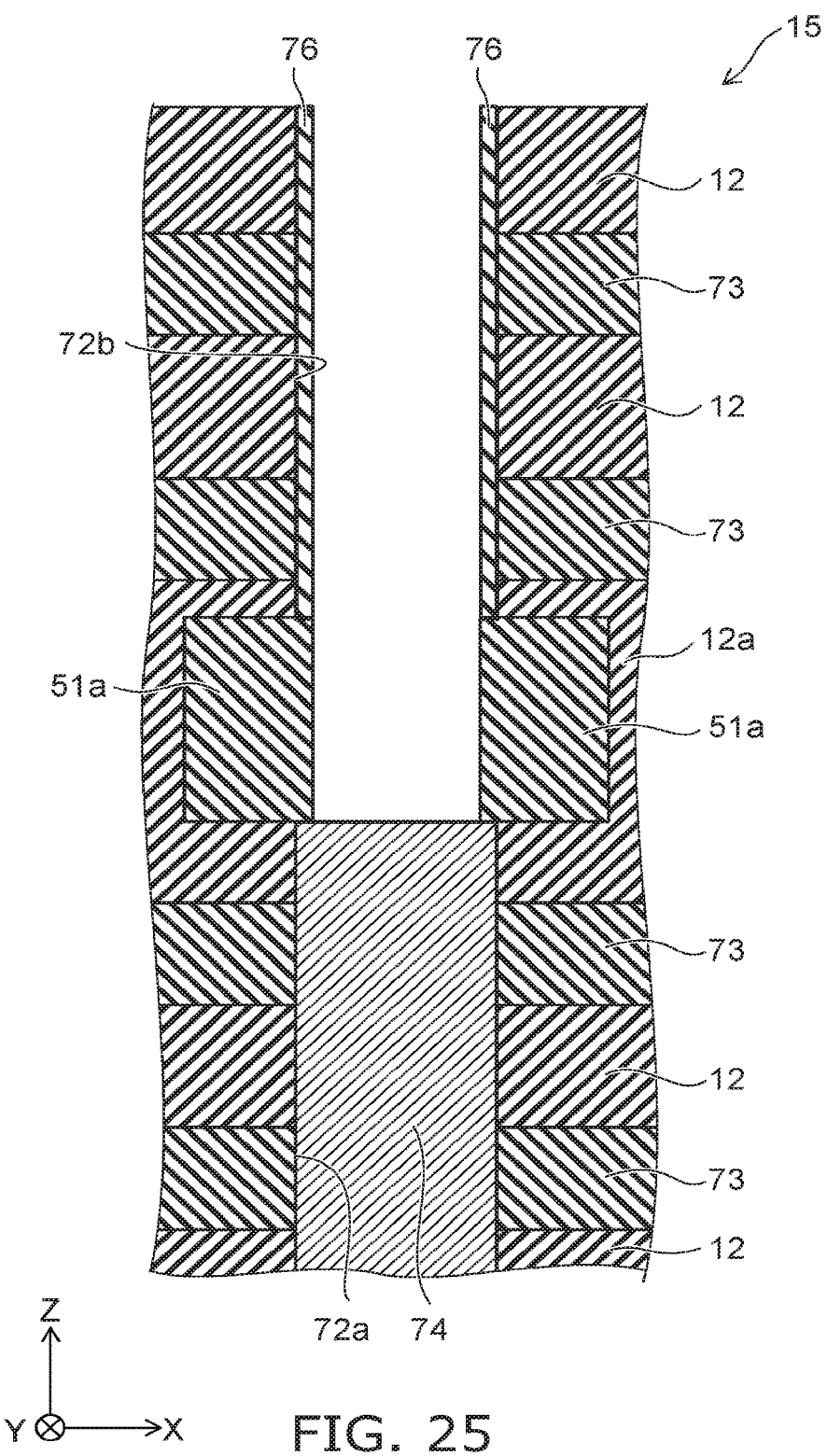

Continuing as shown in FIG. 25, the portions of the protective layer 76 that are formed on the upper surface of the stacked body 15 and on the bottom surface of the memory hole 72b are removed by RIE. Thereby, the sacrificial film 51a is exposed at the bottom surface of the memory hole 72b. Then, the insulating film 51a that is made of silicon nitride is etched by RIE. Thereby, the memory hole 72b pierces the insulating film 51a and reaches the sacrificial member 74. Thereby, the insulating film 51a becomes the insulating member 51 having the annular configuration. At this time, the silicon nitride films 73 are not etched because the silicon nitride films 73 are covered with the protective layer 76 made of silicon oxide.

Figure 26:
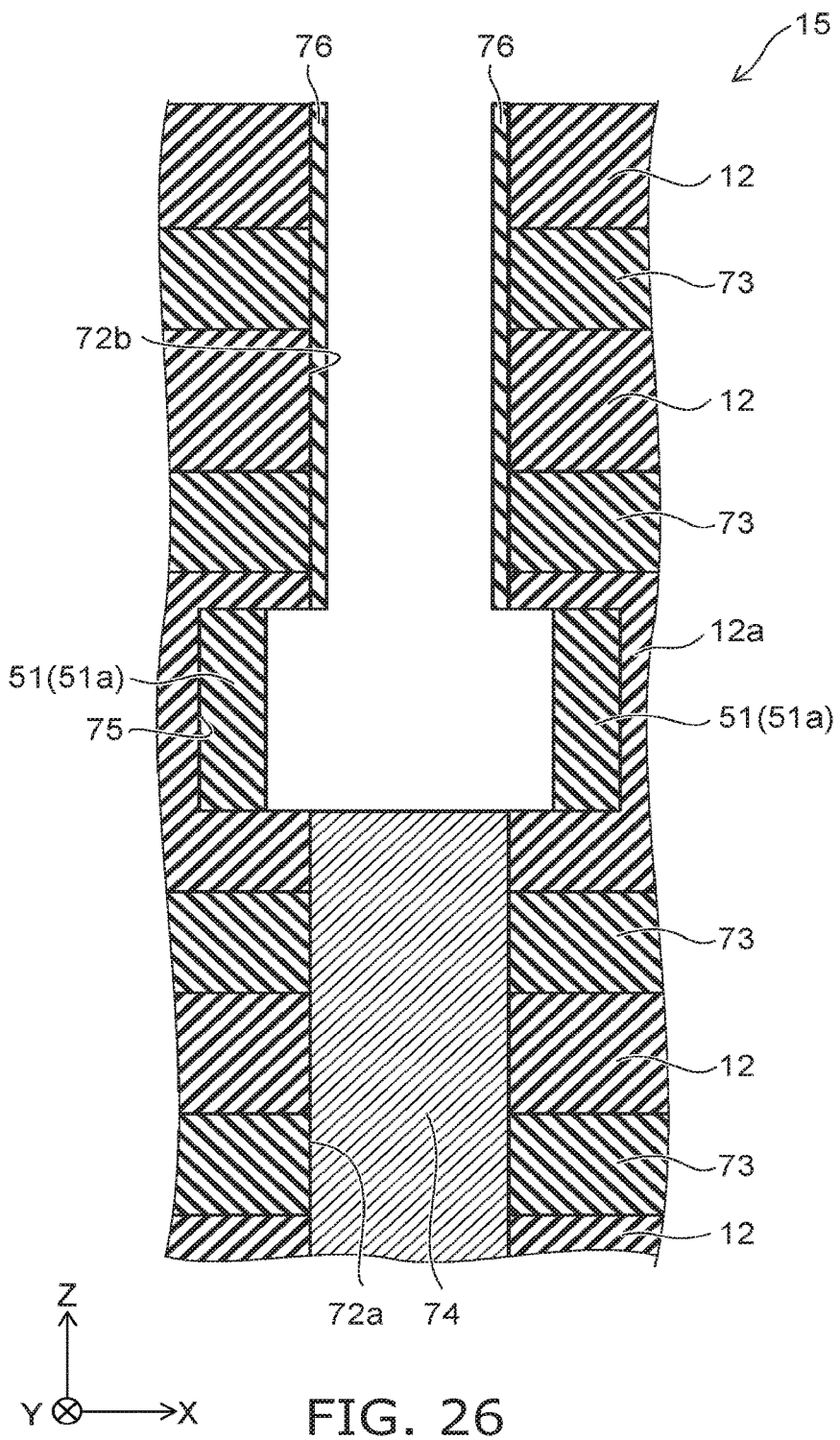

Then, as shown in FIG. 26, the inner surface of the insulating member 51 is etched by wet etching using, for example, hot phosphoric acid. Thereby, the insulating member 51 remains in the outer perimeter portion of the recess 75. At this time, the silicon nitride films 73 are not etched because the silicon nitride films 73 are covered with the protective layer 76.

Figure 27:
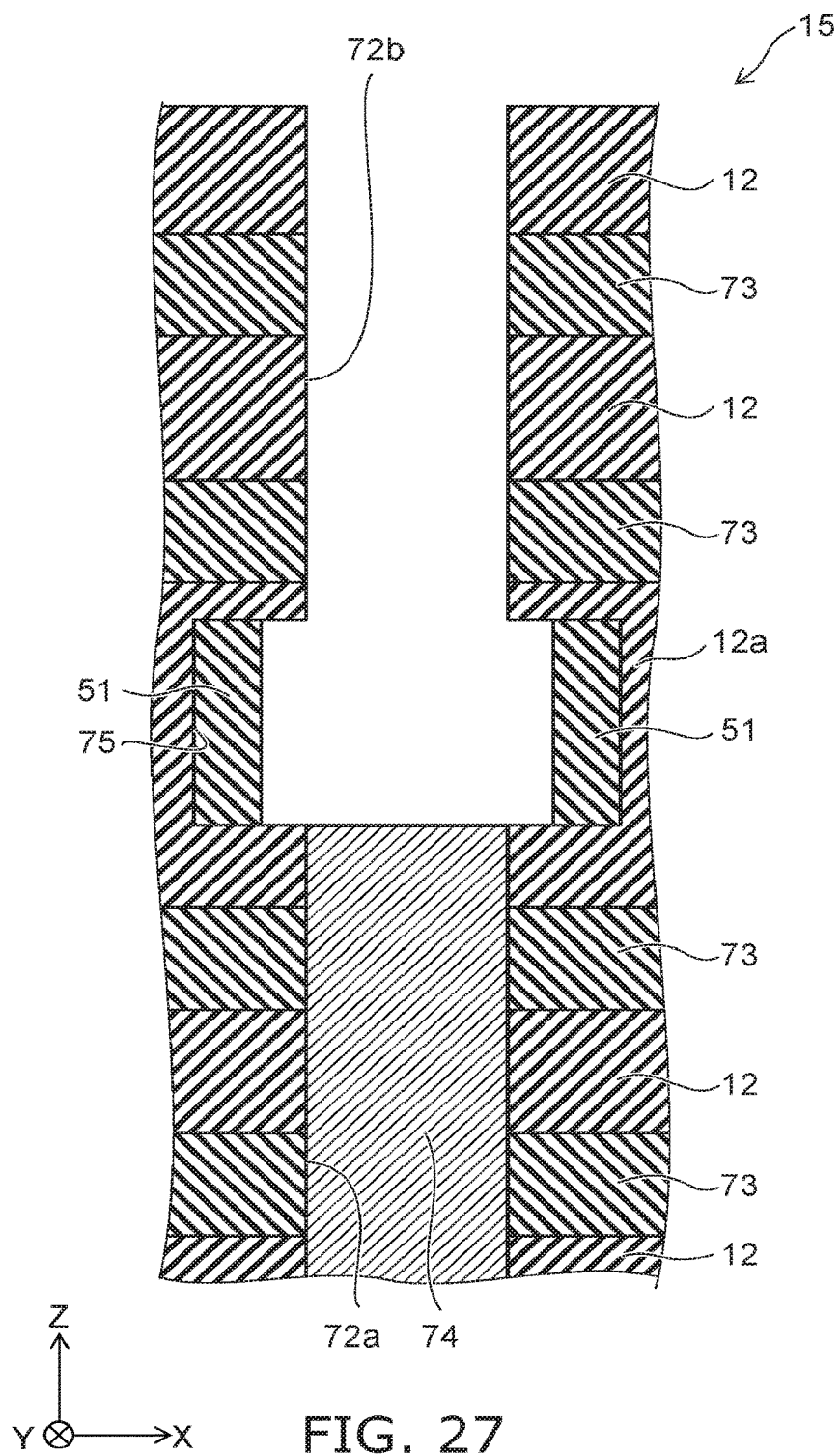

Continuing as shown in FIG. 27, the protective layer 76 (referring to FIG. 26) is removed by, for example, wet etching.

Figure 28:
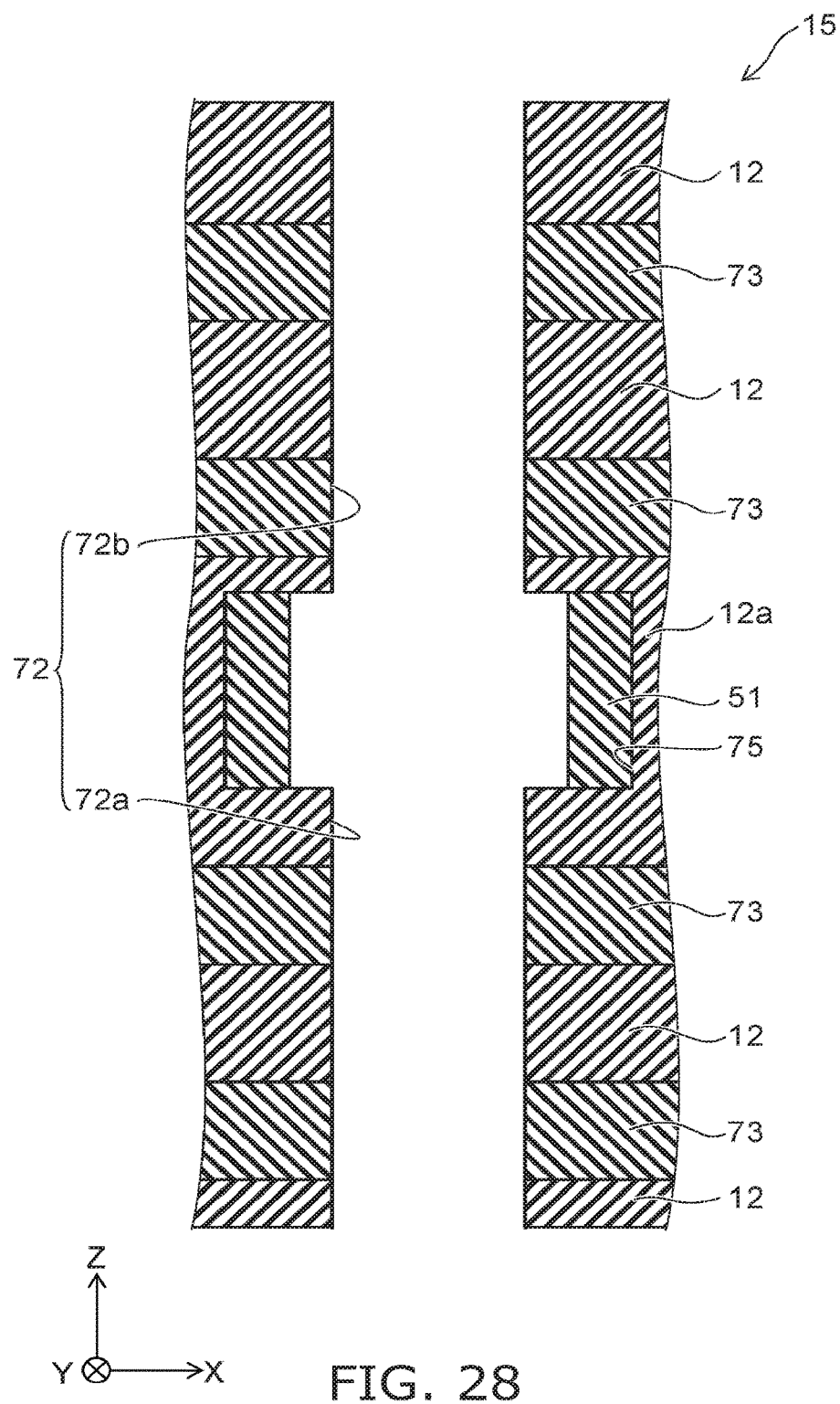

Then, as shown in FIG. 28, the sacrificial member 74 that is made of amorphous silicon (referring to FIG. 27) is removed by etching via the memory hole 72b. Thereby, the memory hole 72b and the memory hole 72a communicate with each other to become a memory hole 72. The lower end of the memory hole 72 reaches the epitaxial silicon layer (not illustrated). In the case where the protective layer 76 (referring to FIG. 26) is formed of amorphous silicon, the sacrificial member 74 and the protective layer 76 may be removed by the same etching.

Figure 29:
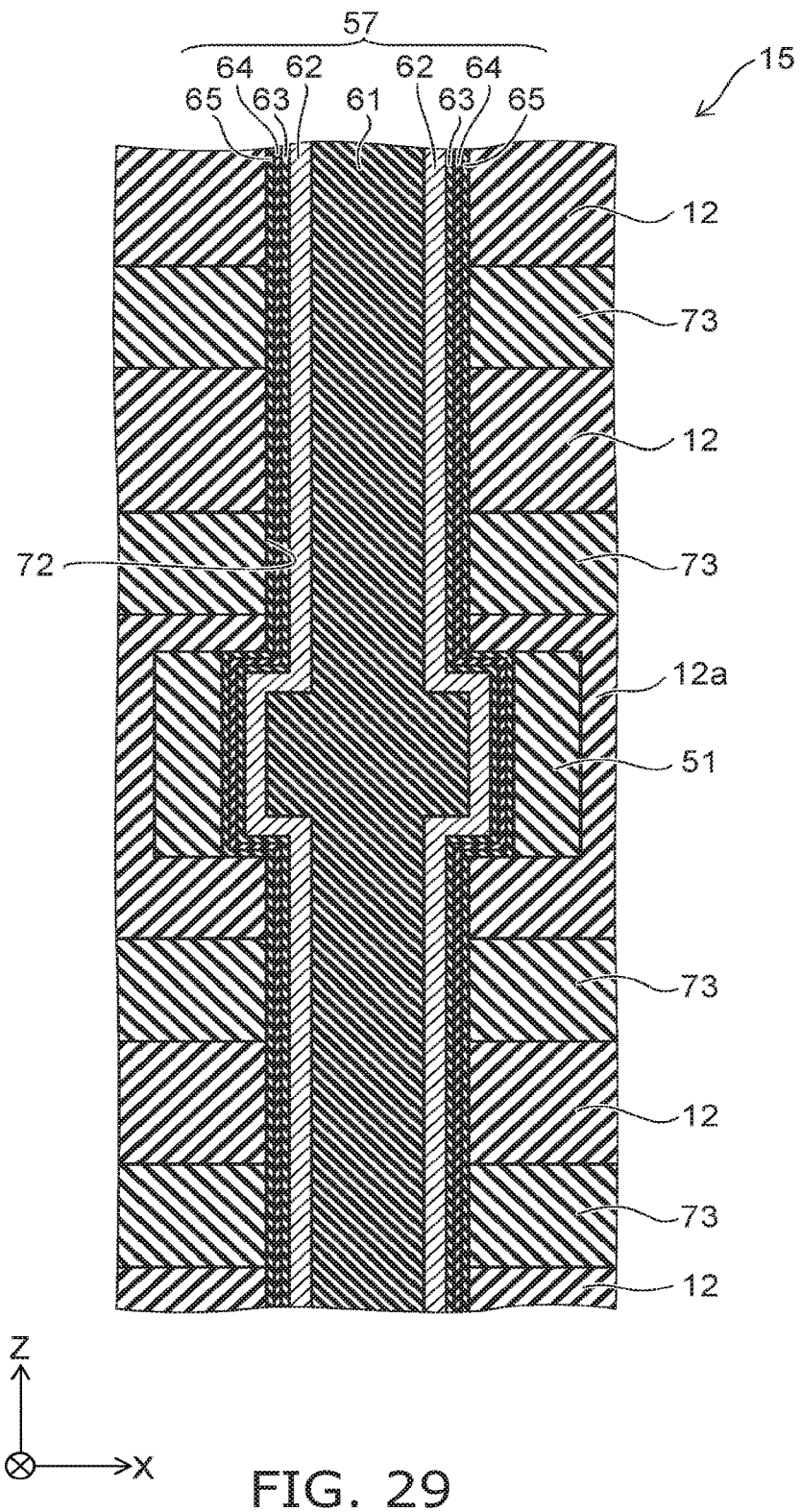

Continuing as shown in FIG. 29, the silicon oxide layer 65, the silicon nitride layer 64, the silicon oxide layer 63, and a silicon layer are formed on the inner surface of the memory hole 72. Then, the silicon layer, the silicon oxide layer 63, the silicon nitride layer 64, and the silicon oxide layer 65 are removed from the bottom surface of the memory hole 72; and the epitaxial silicon layer (not illustrated) is exposed. Then, a silicon layer is deposited again. The silicon layer becomes the silicon layer 62 that is formed as one body with the original silicon layer. The silicon layer 62 contacts the epitaxial silicon layer (not illustrated) and is connected to the silicon substrate 10 (referring to FIG. 17) via the epitaxial silicon layer. Then, the core member 61 is formed by depositing silicon oxide. Thus, the columnar member 57 is formed inside the memory hole 72.

Then, as shown in FIG. 18, a slit (not illustrated) that spreads along the XZ plane and divides the stacked body 15 is formed in the stacked body 15. Then, the silicon nitride films 73 (referring to FIG. 29) are removed by performing etching via the slit. Continuing, the aluminum oxide layer 66 is formed on the inner surface of a space 77 where the silicon nitride films 73 are removed. The blocking insulating film 67 is formed of the aluminum oxide layer 66 and the silicon oxide layer 65. Then, the electrode films 13 are formed by filling a metal material such as, for example, tungsten, etc., into the space 77. Then, the upper structures of the plugs 18, etc., are formed by normal methods. Thus, the integrated circuit device 3 according to the embodiment is manufactured.

Effects of the embodiment will now be described.

In the embodiment, the memory hole 72b is formed in the stacked body 15b of the upper level in the process shown in FIG. 23 after the memory hole 72a is formed in the stacked body 15a of the lower level in the process shown in FIG. 19. Thus, by dividing the formation into two, the memory hole 72 that has a high aspect ratio can be formed with high precision. Thereby, the integration of the memory cells of the integrated circuit device 3 improves.

In the embodiment, the insulating film 51a is formed on the memory hole 72a in the processes shown in FIG. 20 and FIG. 21; and the memory hole 72b that reaches the insulating film 51a is formed in the process shown in FIG. 23. Therefore, the memory hole 72b does not deeply penetrate the stacked body 15a of the lower level because the elongation of the memory hole 72b stops by reaching the insulating film 51a even if the central axis of the memory hole 72b of the upper portion is shifted with respect to the central axis of the memory hole 72a of the lower portion due to the error of the lithography, etc. The linking portion between the memory hole 72b and the memory hole 72a is widened by the etch-back of the insulating member 51 from the inner side in the process shown in FIG. 26. As a result, the columnar member 57 can be formed stably inside the memory hole 72 in the process shown in FIG. 29. Therefore, the reliability of the integrated circuit device 3 is high.

In the embodiment, by forming the insulating film 51a of an insulating material, the insulating member 51 that remains after forming the memory hole 72 also is formed of the insulating material. As a result, the parasitic capacitance between mutually-adjacent silicon layers 62 is determined by the distance between the middle portions 62d and is not determined by the distance between the insulating members 51. Therefore, the parasitic capacitance between the silicon layers 62 can be reduced.

Modification of Third Embodiment

A modification of the third embodiment will now be described.

Figure 30:
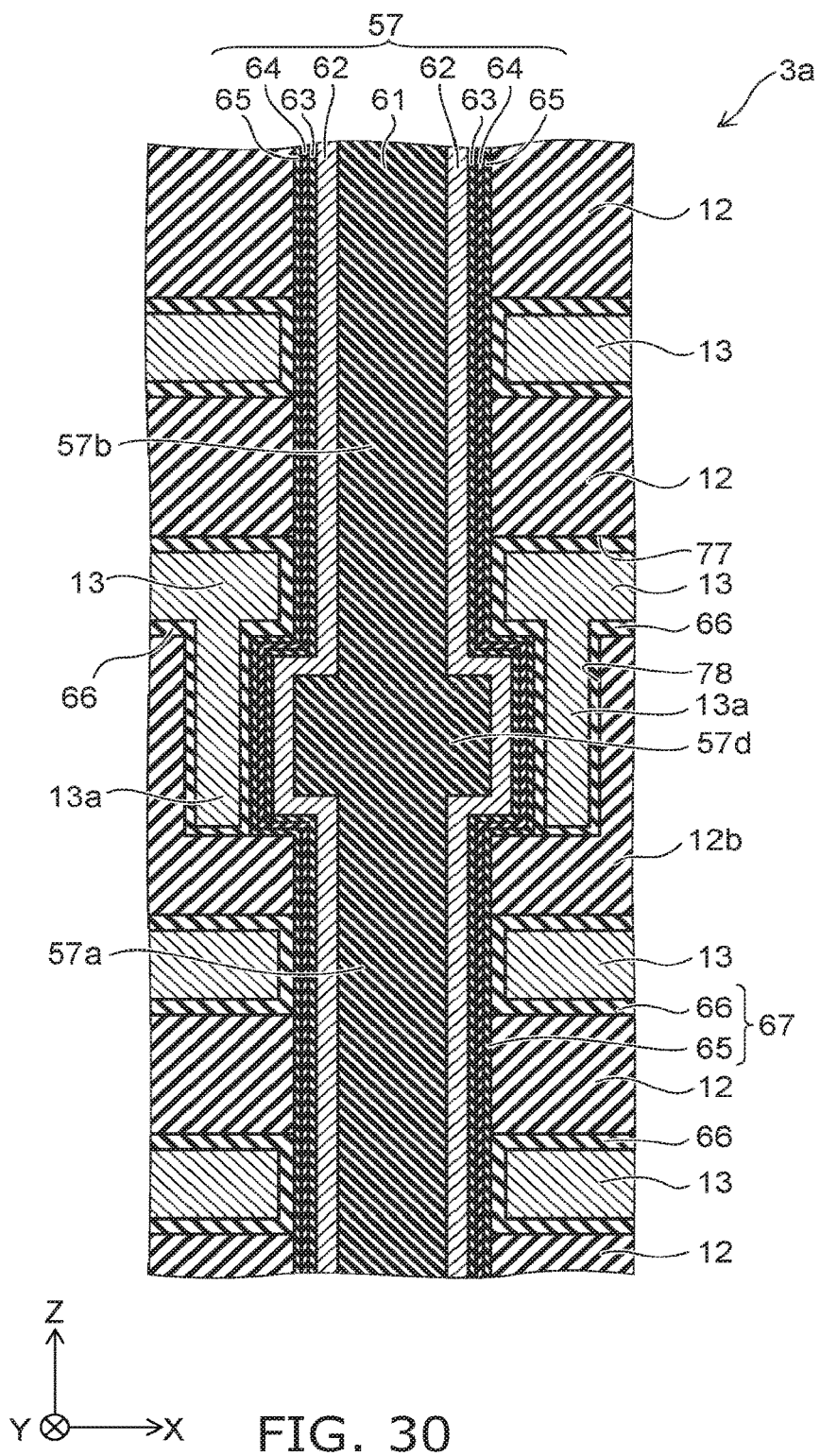
FIG. 30 is a cross-sectional view showing a columnar member of an integrated circuit device according to a modification of the third embodiment.

FIG. 30 is a cross-sectional view showing a columnar member of an integrated circuit device according to the modification.

As shown in FIG. 30, the integrated circuit device 3a according to the modification differs from the integrated circuit device 3 according to the third embodiment described above (referring to FIG. 18) in that the insulating member 51 (referring to FIG. 18) is not provided around the middle portion 57d of the columnar member 57; and an extension portion 13a of the electrode film 13 is provided instead. The extension portion 13a extends downward onto the side surface of the middle portion 62d from the electrode film 13 of the lowermost level of the stacked body 15b, i.e., the electrode film 13 most proximal to the middle portion 62d of the electrode films 13 provided around the upper portion 62b of the silicon layer 62. The configuration of the extension portion 13a is an annular configuration surrounding the middle portion 57d. The extension portion 13a is formed as one body with the electrode film 13 that is on the extension portion 13a; and the aluminum oxide layer 66 is provided around the extension portion 13a. In the device 3a, the silicon oxide film 12b is provided instead of the silicon oxide film 12a.

A method for manufacturing the integrated circuit device according to the modification will now be described.

Figure 31:
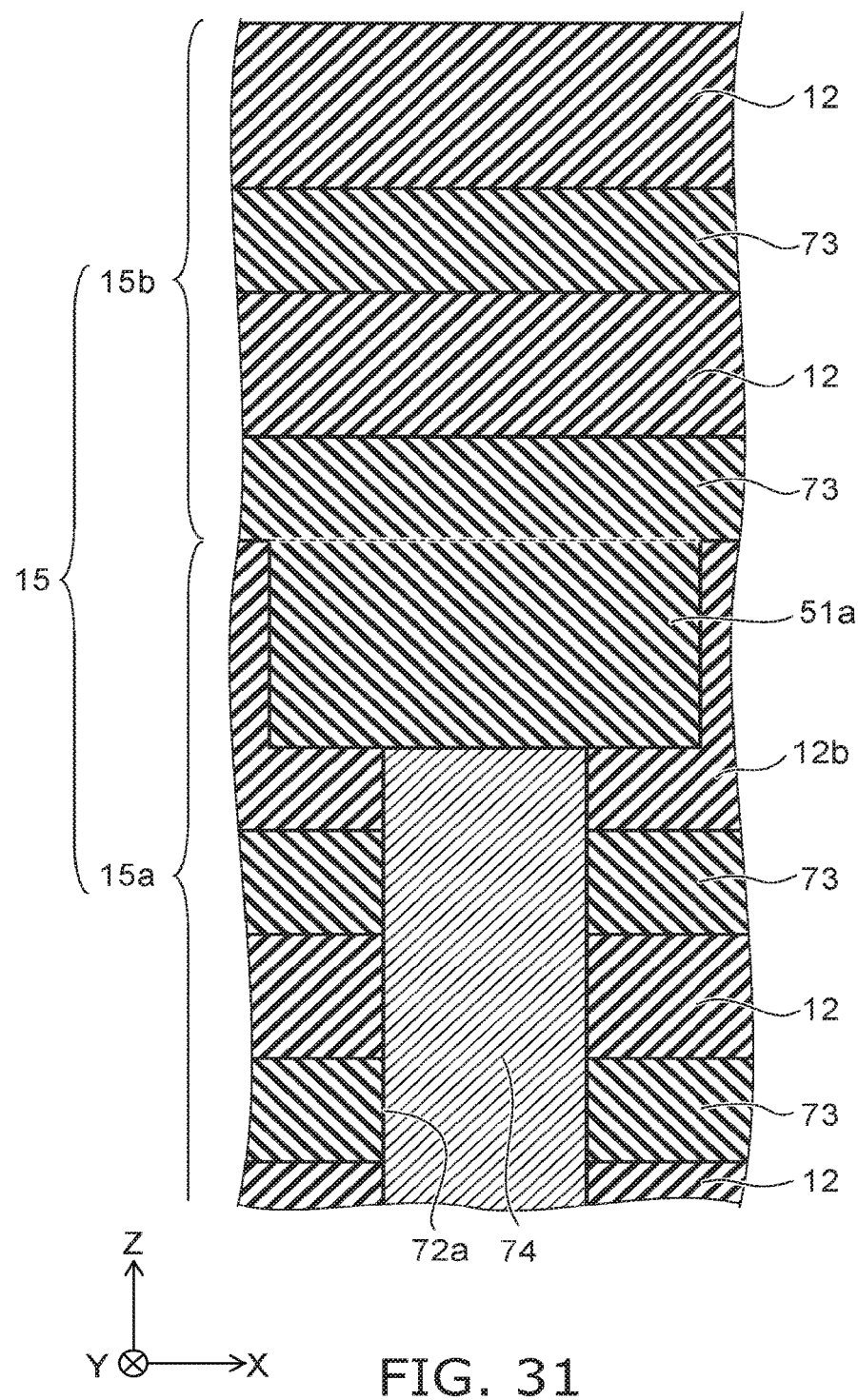
FIG. 31 and FIG. 32 are cross-sectional views showing a method for manufacturing an integrated circuit device according to the modification of the third embodiment.
Figure 32:
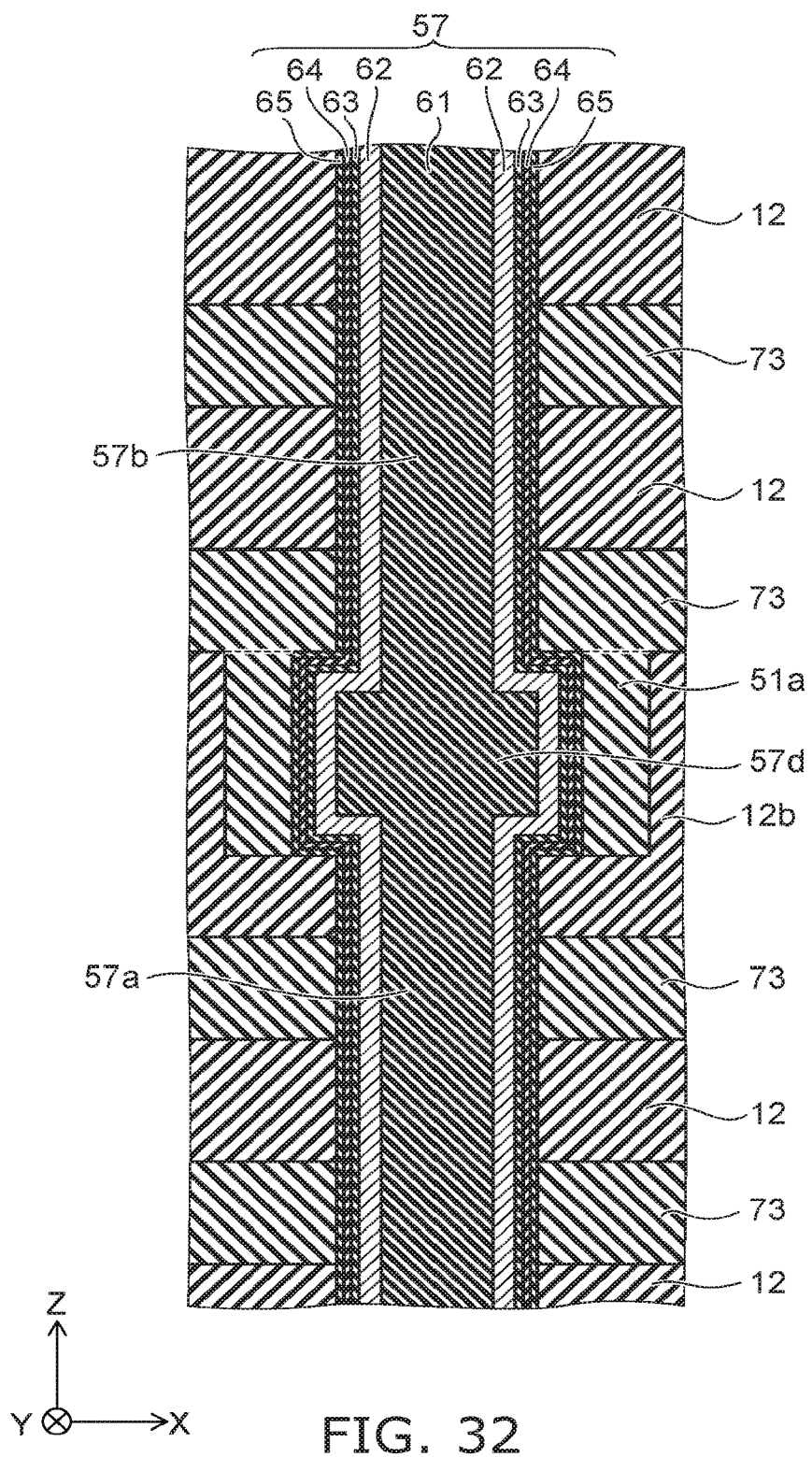

FIG. 31 and FIG. 32 are cross-sectional views showing the method for manufacturing the integrated circuit device according to the modification.

First, the processes shown in FIG. 19 to FIG. 21 are implemented.

Then, as shown in FIG. 31, the silicon nitride film 73 and the silicon oxide film 12 are formed alternately on the silicon oxide film 12b and the insulating film 51a without forming the silicon oxide film 12c (referring to FIG. 22). Thereby, the stacked body 15b of the upper level is formed. At this time, the insulating film 51a that is made of silicon nitride contacts the silicon nitride film 73 of the lowermost level of the stacked body 15b.

Then, the processes shown in FIG. 23 to FIG. 29 are implemented.

Thereby, the intermediate structure body shown in FIG. 32 is made.

Then, as shown in FIG. 30, a slit (not illustrated) is formed in the stacked body 15; and the silicon nitride films 73 are removed via the slit. At this time, the insulating film 51a also is removed to form a recess 78 communicating with the space 77.

Continuing, the aluminum oxide layer 66 is formed via the slit on the inner surfaces of the recess 78 and the space 77. Then, a metal material is deposited via the slit. Thereby, the extension portion 13a is filled into the recess 78; and the electrode film 13 is filled into the space 77. Thus, the integrated circuit device 3a according to the modification is manufactured.

In the modification, the dominance of the electrode film 13 for the middle portion 62d is high because the middle portion 62d of the silicon layer 62 is surrounded with the extension portion 13a of the electrode film 13. Thereby, the ON resistance of the middle portion 62d can be reduced.

Otherwise, the configuration, the manufacturing method, and the effects of the modification are similar to those of the third embodiment described above.

Fourth Embodiment

A fourth embodiment will now be described.

Figure 33:
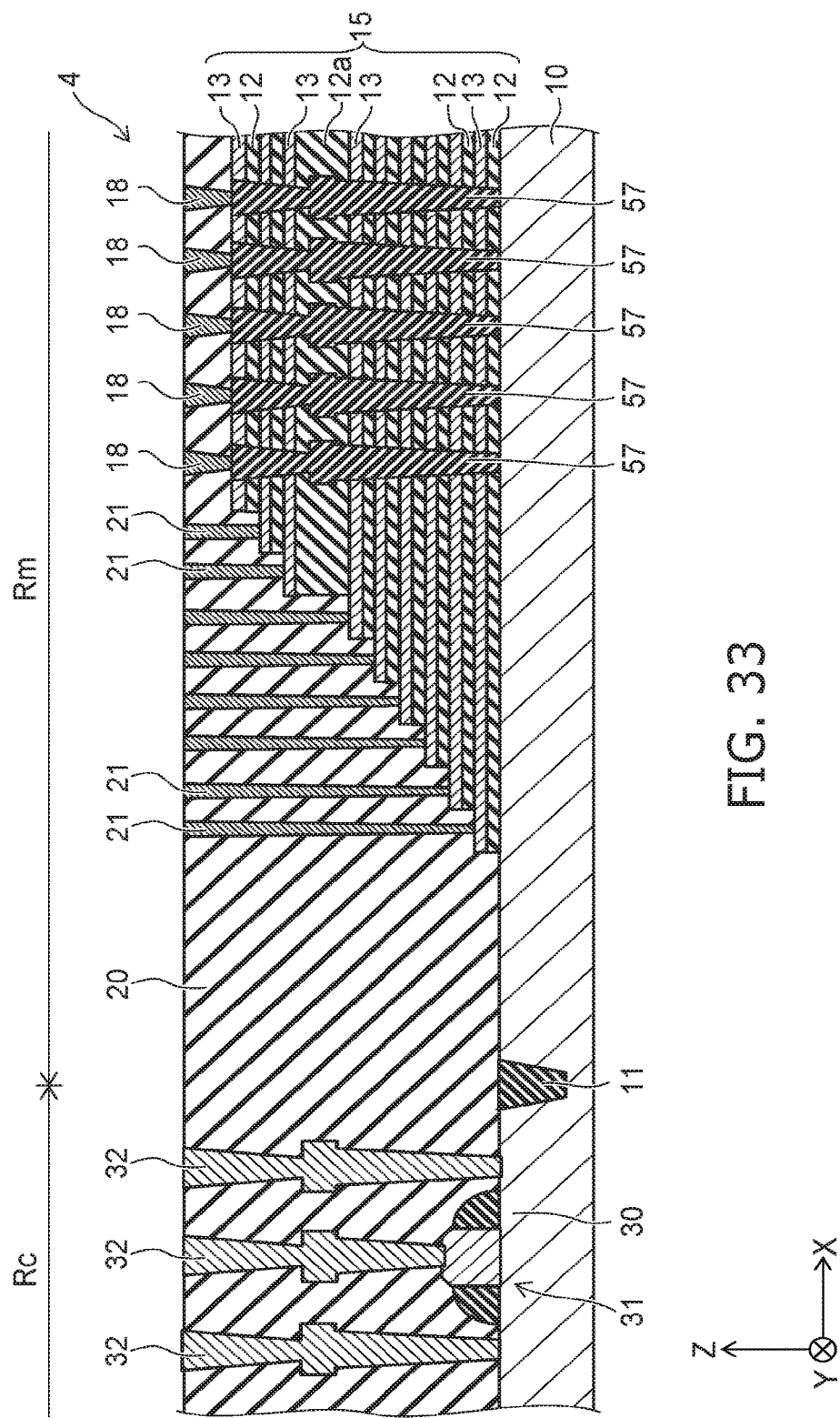
FIG. 33 is a cross-sectional view showing an integrated circuit device according to a fourth embodiment.

FIG. 33 is a cross-sectional view showing an integrated circuit device according to the embodiment.

In the integrated circuit device 4 according to the embodiment as shown in FIG. 33, the contact 32 that has a two-step configuration is provided in the peripheral circuit region Rc; and the columnar member 57 that has a two-step configuration is provided in the memory region Rm. The configuration of the contact 32 is as described in the first embodiment described above (referring to FIG. 2 and FIG. 3); and the configuration of the columnar member 57 is as described in the third embodiment described above (referring to FIG. 18). The middle portion 32d of the contact 32 and the middle portion 57d of the columnar member 57 are at the same position in the Z-direction.

A method for manufacturing the integrated circuit device according to the embodiment will now be described.

FIG. 34 to FIG. 38 are cross-sectional views showing the method for manufacturing the integrated circuit device according to the embodiment.

The description recited below is schematic. The details of the processes are as described in the first and third embodiments described above.

Figure 34:
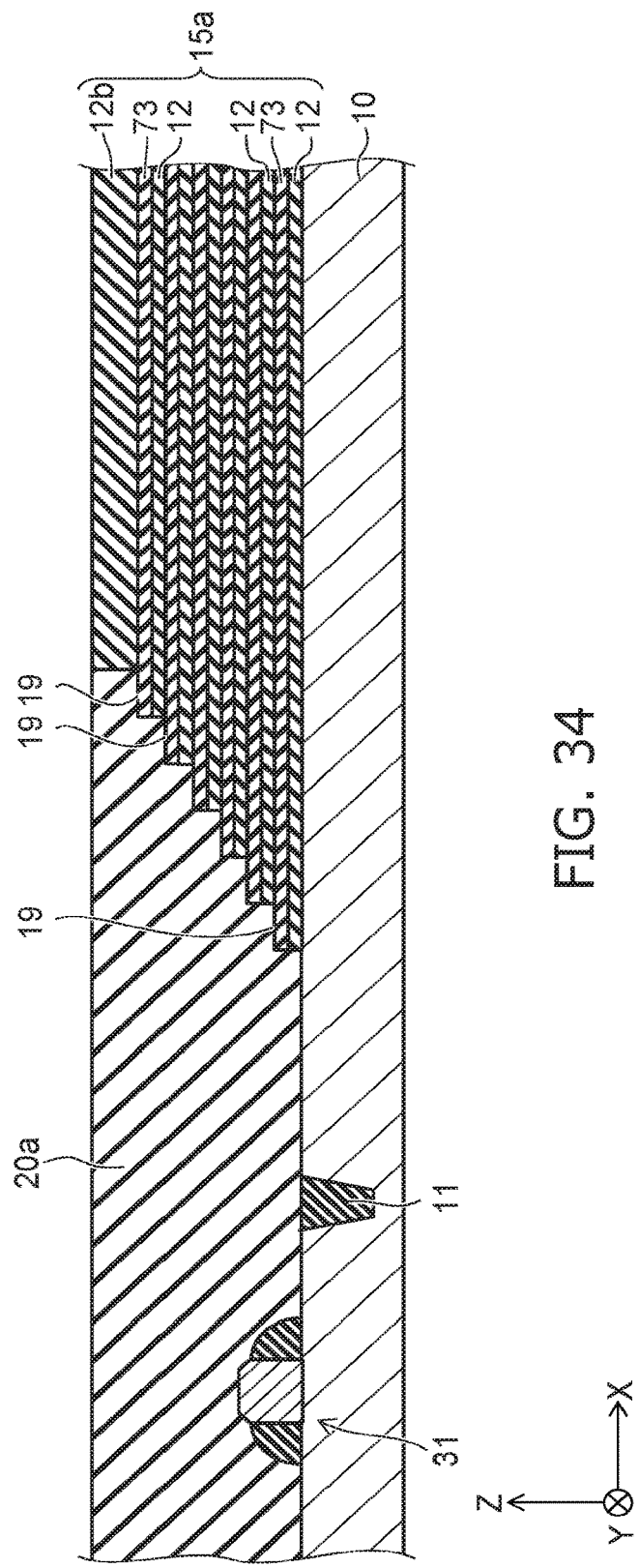
FIG. 34 to FIG. 38 are cross-sectional views showing a method for manufacturing an integrated circuit device according to the fourth embodiment.

First, as shown in FIG. 34, the STI 11 is formed in the upper layer portion of the silicon substrate 10; and the transistor 31 is formed. Then, the stacked body 15a is formed by alternately stacking the silicon oxide film 12 and the silicon nitride film 73. The uppermost level of the stacked body 15a is the thick silicon oxide film 12b. Then, the end portion of the stacked body 15a is patterned into a staircase configuration; and the terrace 19 is formed every silicon nitride film 73. Then, the inter-layer insulating film 20a is formed to bury the stacked body 15a by, for example, CVD (Chemical Vapor Deposition) using d-TEOS (Tetra Ethyl Ortho Silicate ($Si(OC_2H_5)_4$)) as a source material; and the upper surface is planarized by, for example, CMP.

Figure 35:
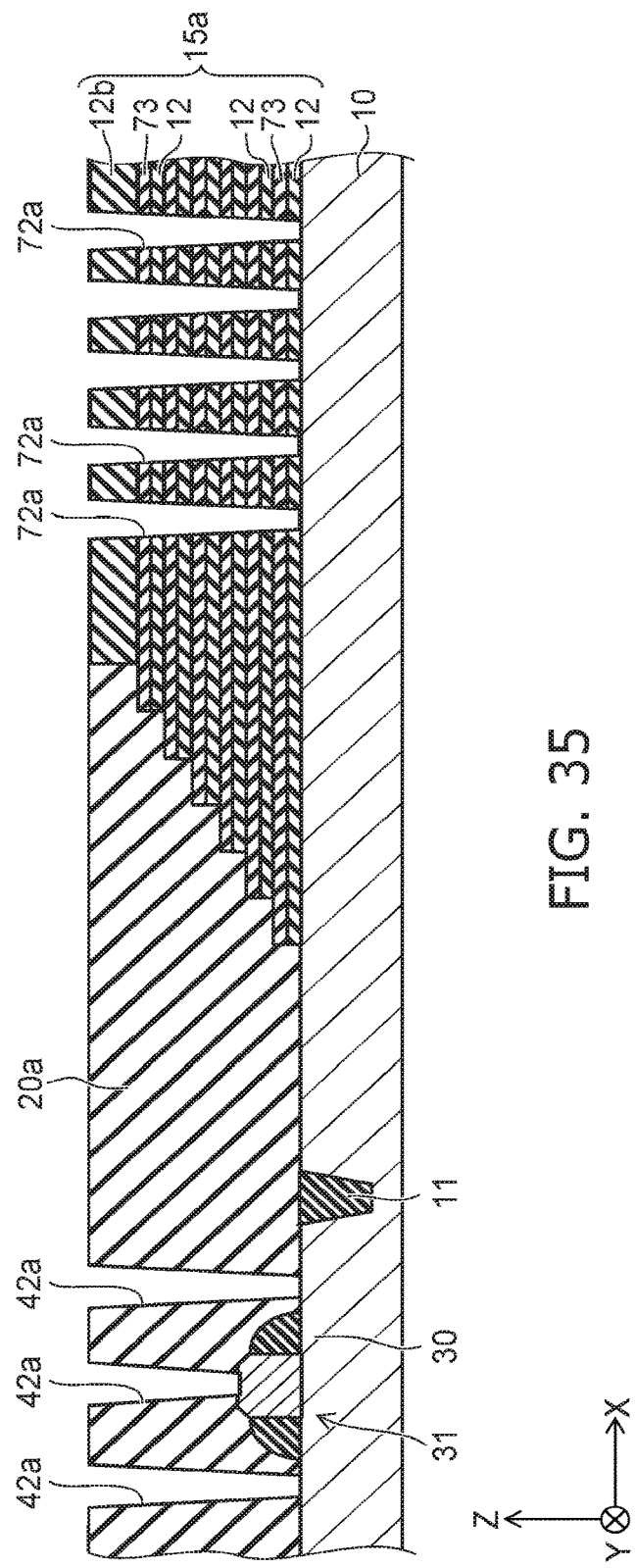

Then, as shown in FIG. 35 and FIG. 19, the memory holes 72a are formed in the stacked body 15a. The memory holes 72a reach the silicon substrate 10. Continuing, an epitaxial silicon layer (not illustrated) is grown on the bottom portions of the memory holes 72a. Then, as shown in FIG. 35 and FIG. 4, the contact holes 42a are formed in the inter-layer insulating film 20a.

Continuing, by depositing amorphous silicon and performing etch-back as shown in FIG. 36, FIG. 19, FIG. 4, and FIG. 5, the sacrificial member 74 is filled into the portions inside the memory holes 72a other than the uppermost portions; and the sacrificial member 44 is filled into the portions inside the contact holes 42a other than the uppermost portions.

Figure 36:
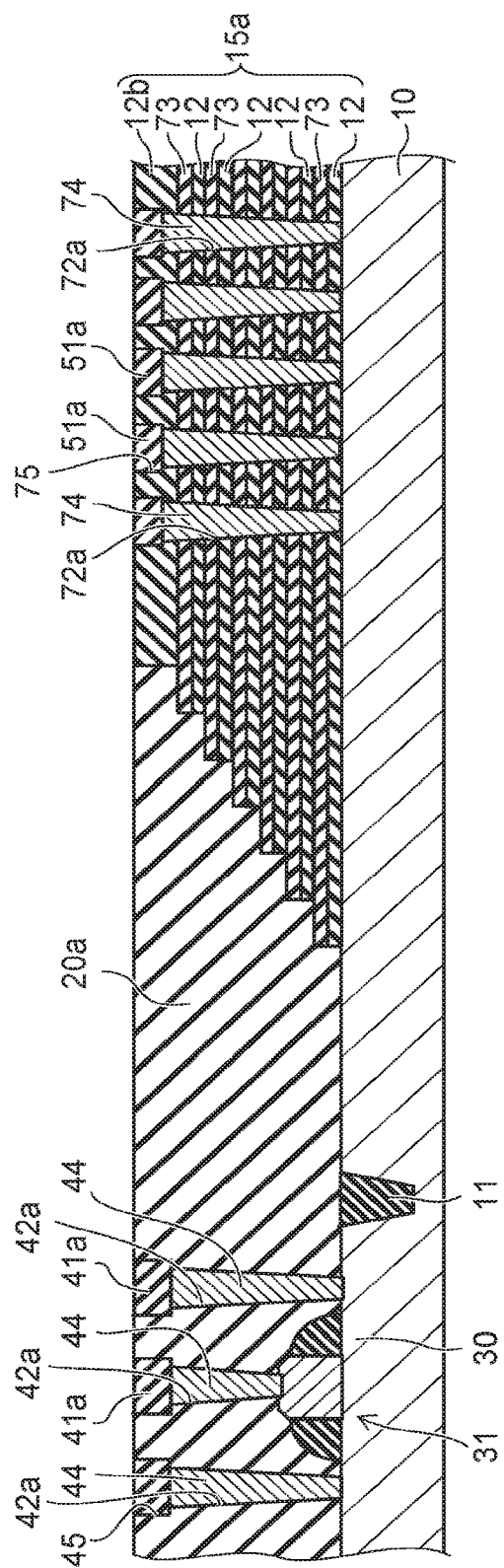

Then, by etching the silicon oxide film 12b and the inter-layer insulating film 20a as shown in FIG. 36, FIG. 20, and FIG. 6, the recesses 75 are formed by enlarging the uppermost portions of the memory holes 72a; and the recesses 45 are formed by enlarging the uppermost portions of the contact holes 42a.

Continuing, by depositing silicon nitride and performing etch-back as shown in FIG. 36, FIG. 21, FIG. 7, and FIG. 8, the insulating film 51a is formed inside the recesses 75; and the insulating film 41a is formed inside the recesses 45.

Figure 37:
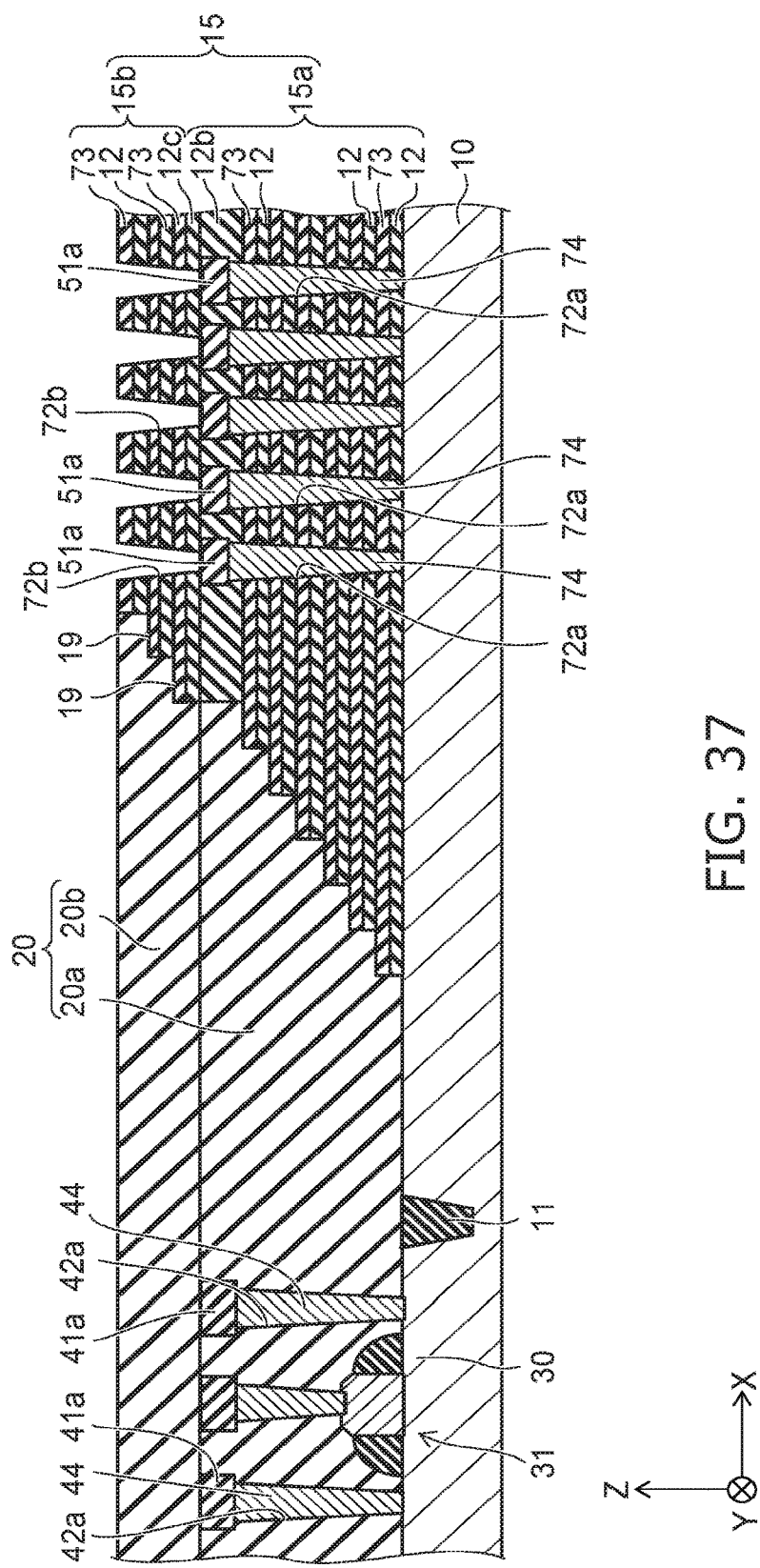

Then, as shown in FIG. 37 and FIG. 22, the silicon oxide film 12c is formed on the stacked body 15a; and subsequently, the stacked body 15b is formed by alternately forming the silicon nitride film 73 and the silicon oxide film 12. Continuing, the end portion of the stacked body 15b is patterned into a staircase configuration; and the terrace 19 is formed every silicon nitride film 73. Then, the inter-layer insulating film 20b is formed by depositing silicon oxide by, for example, CVD using d-TEOS as a source material and by planarizing the upper surface. The inter-layer insulating film 20b buries the staircase portion of the stacked body 15b. Then, the memory holes 72b are formed in the stacked body 15b as shown in FIG. 37 and FIG. 23. The memory holes 72b are formed in the regions directly above the memory holes 72a and reach the insulating film 51a.

Figure 38:
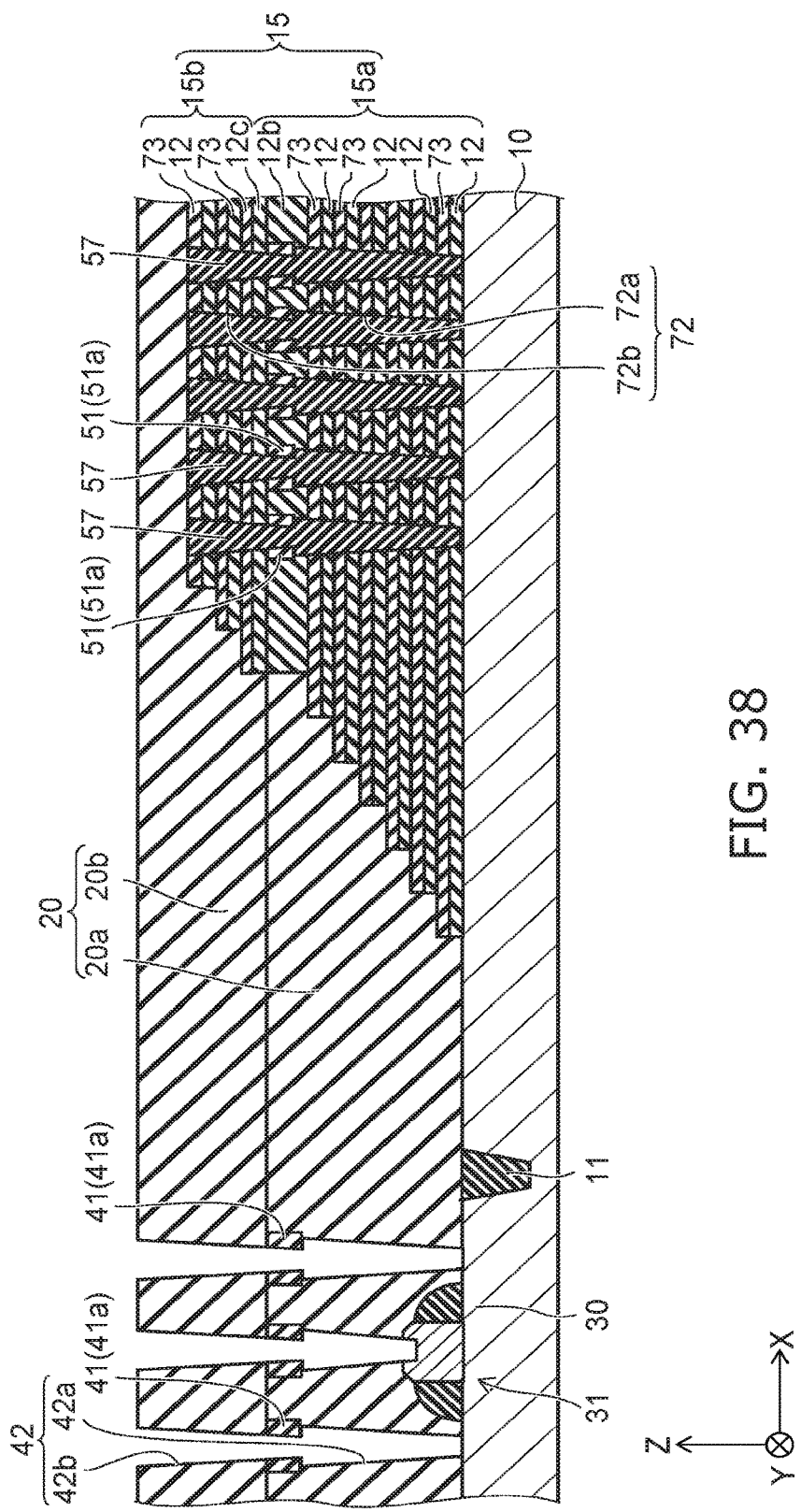

Continuing as shown in FIG. 38 and FIG. 24 to FIG. 27, the insulating film 51a is etched downward; subsequently, the insulating film 51a is etched toward the outside to form the insulating members 51 having the annular configurations. Then, as shown in FIG. 38 and FIG. 28, the memory holes 72 are formed by causing the memory holes 72b to communicate with the memory holes 72a by removing the sacrificial member 74 (referring to FIG. 37). Then, as shown in FIG. 38 and FIG. 29, the columnar members 57 are formed inside the memory holes 72. Then, the inter-layer insulating film 20b is thickened by depositing silicon oxide.

Then, as shown in FIG. 38 and FIG. 10, the contact holes 42b are formed in the inter-layer insulating film 20b. The contact holes 42b are formed in the regions directly above the contact holes 42a, pierce the insulating film 41a, and reach the sacrificial member 44. The insulating members 41 that have the annular configurations are formed by the contact holes 42b piercing the insulating film 41a. Then, as shown in FIG. 38 and FIG. 11, the sacrificial member 44 (referring to FIG. 37) is removed via the contact holes 42b. Thereby, the contact holes 42b communicate with the contact holes 42a; and the contact holes 42 are formed.

Continuing as shown in FIG. 33, in the inter-layer insulating film 20, plug holes for forming the plugs 18 are formed in the regions directly above the columnar members 57; and the contact holes for forming the contacts 21 are formed in the regions directly above the terraces 19. Then, by depositing a metal material such as tungsten, etc., on the entire surface, the plugs 18 are formed inside the plug holes; the contacts 21 are formed inside the contact holes on the terraces 19; and the contacts 32 are formed inside the contact holes 42.

Then, as shown in FIG. 33 and FIG. 18, a slit is formed in the stacked body 15; and the space 77 is formed by removing the silicon nitride films 73 via the slit. Then, the aluminum oxide layer 66 is formed on the inner surface of the space 77; and the electrode films 13 are formed inside the space 77. Thus, the integrated circuit device 4 according to the embodiment is manufactured.

Effects of the embodiment will now be described.

According to the embodiment, a portion of the process for forming the columnar member 57 having the two-step configuration and a portion of the process for forming the contact 32 having the two-step configuration can be used commonly. Therefore, the productivity of the integrated circuit device 4 is high.

Otherwise, the configuration, the manufacturing method, and the effects of the embodiment are similar to those of the first and third embodiments described above.

Although an example is shown in the embodiment in which the first embodiment and the third embodiment described above are combined, this is not limited thereto; and, for example, the second embodiment and the third embodiment may be combined. In such a case, it is sufficient to etch the insulating member 41 from the inner side in the process shown in FIG. 38 and FIG. 10. Also, the first embodiment, the second embodiment, or a modification of the first embodiment or the second embodiment may be combined with the third embodiment or a modification of the third embodiment.

The materials of the insulating members 41 and 51 are not limited to silicon nitride; it is sufficient to use an insulating material that provides etching selectivity between the material and the inter-layer insulating film 20; and, for example, a metal oxide such as aluminum oxide, hafnium oxide, etc., may be used.

According to the embodiments described above, an integrated circuit device having a small parasitic capacitance and a method for manufacturing the integrated circuit device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An integrated circuit device, comprising:
an insulating film;
a contact extending in a first direction and being provided inside the insulating film, the contact including a first portion, a second portion, and a third portion arranged in this order along the first direction, a diameter of the second portion being larger than a diameter of the first portion in a second direction orthogonal to the first direction, the diameter of the second portion being larger than a diameter of the third portion in the second direction, a side surface of the first portion and a side surface of the third portion contacting the insulating film; and
an insulating member contacting a side surface of the second portion, a composition of the insulating member being different from a composition of the insulating film.

2. The device according to claim 1, wherein a configuration of the insulating member is an annular configuration surrounding the contact.

3. An integrated circuit device, comprising:
a stacked body including a plurality of insulating films and a plurality of electrode films stacked alternately along a first direction;
a semiconductor member extending in the first direction and being provided inside the stacked body, the semiconductor member including a first portion, a second portion, and a third portion arranged in this order along the first direction, the second portion being disposed inside one of the insulating films, a diameter of the second portion being larger than a diameter of the first portion in a second direction orthogonal to the first direction, the diameter of the second portion being larger than a diameter of the third portion in the second direction; and
a charge storage film provided between the semiconductor member and one of the electrode films.

4. The device according to claim 3, further comprising an insulating member provided on a side surface of the second portion, a composition of the insulating member being different from a composition of the insulating film.

5. The device according to claim 4, wherein a configuration of the insulating member is an annular configuration surrounding the second portion.

6. The device according to claim 3, wherein the electrode film most proximal to the second portion of the plurality of electrode films provided around the third portion includes an extension portion extending onto a side surface of the second portion.

7. The device according to claim 6, wherein a configuration of the extension portion is an annular configuration surrounding the second portion.

8. An integrated circuit device, comprising:
a substrate;
a stacked body provided in a first region on the substrate, the stacked body including a plurality of first insulating films and a plurality of electrode films stacked alternately along a first direction;
a second insulating film provided in a second region on the substrate;

a semiconductor member extending in the first direction and being provided inside the stacked body, the semiconductor member including a first portion, a second portion, and a third portion arranged in this order along the first direction, the second portion being disposed inside one of the first insulating films, a diameter of the second portion being larger than a diameter of the first portion in a second direction orthogonal to the first direction, the diameter of the second portion being larger than a diameter of the third portion;

a charge storage film provided between the semiconductor member and one of the electrode films;

a contact extending in the first direction and being provided inside the second insulating film; and a first insulating member contacting a side surface of the contact, a composition of the first insulating member being different from a composition of the second insulating film.

9. The device according to claim 8, wherein a level difference is formed in the side surface of the contact, a portion of a region of the side surface other than the level difference contacts the second insulating film, and the first insulating member contacts the level difference.

10. The device according to claim 8, wherein a first portion, a second portion, and a third portion of the contact are arranged in this order along the first direction, a diameter of the second portion is larger than a diameter of the first portion in the second direction, the diameter of the second portion is larger than a diameter of the third portion in the second direction, a side surface of the first portion and a side surface of the third portion contact the second insulating film, and the first insulating member contacts a side surface of the second portion.

11. The device according to claim 8, further comprising a second insulating member provided on a side surface of the second portion of the semiconductor member, a composition of the second insulating member being different from a composition of the first insulating film, a position of an upper surface of the first insulating member being equal to a position of an upper surface of the second insulating member in the first direction.

* * * * *